United States Patent [19]
Rao et al.

[11] Patent Number: 5,949,712
[45] Date of Patent: Sep. 7, 1999

[54] NON-VOLATILE MEMORY ARRAY USING GATE BREAKDOWN STRUCTURE

[75] Inventors: Kameswara K. Rao, San Jose; Martin L. Voogel, Santa Clara, both of Calif.

[73] Assignee: Xilinx, Inc., San Jose, Calif.

[21] Appl. No.: 08/826,456

[22] Filed: Mar. 27, 1997

[51] Int. Cl.⁶ ....................................... G11C 11/34
[52] U.S. Cl. ........................... 365/185.07; 365/226
[58] Field of Search ............... 365/185.07, 226, 365/154, 156; 327/536, 537

[56] References Cited

U.S. PATENT DOCUMENTS

| | | | |
|---|---|---|---|
| 4,980,859 | 12/1990 | Guterman | 365/228 |
| 5,523,971 | 6/1996 | Rao | 365/185.07 |
| 5,579,524 | 11/1996 | Kikinis | 365/227 |
| 5,581,455 | 12/1996 | Rossi | 327/536 |
| 5,612,249 | 3/1997 | Sun | 437/69 |
| 5,646,885 | 7/1997 | Matsuo | 365/185.07 |

*Primary Examiner*—A. Zarabian
*Attorney, Agent, or Firm*—Norman R. Klivans; Skjerven, Morrill, MacPherson, Franklin & Friel; E. Eric Hoffman

[57] ABSTRACT

Non-volatile storage elements are provided in an array on an integrated circuit, where the non-volatile storage elements are low voltage CMOS devices and hence compatible in a manufacturing sense with other similar transistors on an integrated circuit, thereby not requiring special types of transistors for the non-volatile storage. The non-volatile storage elements are one-time programmable devices which are programmed by rupturing their gate oxide.

10 Claims, 26 Drawing Sheets

NON-VOLATILE MEMORY ARRAY USING GATE BREAKDOWN STRUCTURE

BACKGROUND OF THE INVENTION

1. Field of the Invention

This invention relates to integrated circuits and more specifically to non-volatile storage for standard CMOS low voltage integrated circuits.

2. Description of the Related Art

Most integrated circuits ("chips") now in use are fabricated in what is called CMOS (complementary metal oxide semiconductor) technology which forms both PMOS and NMOS transistors in a silicon substrate. One of the main objectives of integrated circuit technology is to minimize transistor size. Typically, transistors are described in terms of their minimum feature dimension. Current technology provides a minimum feature size of 0.35 μm (also referred to as a "line width") referring to the minimum width of a transistor feature such as gate width, the separation between source and drain diffusions. Typically, such 0.35 μm technology is used to form CMOS transistors having a gate oxide thickness of 70 Å. The gate "oxide", actually a silicon dioxide layer, is the electrically insulating (dielectric) layer interposed between the conductive gate electrode, which is typically a polycrystalline silicon structure formed overlying the principal surface of the silicon substrate in which the integrated circuit is formed, and the underlying silicon which typically is the channel portion of the transistor extending between the source and drain regions. Transistors of such 0.35 μm size typically operate at a voltage of 3.3 volts. A greater voltage is likely to destroy the transistor by rupturing the gate oxide.

In the field of data storage, there are two main types of storage elements. The first type is a volatile storage element such as typically used in DRAM (dynamic random access memory) or SRAM (static random access memory) in which the information stored in a particular storage element is lost the instant that power is removed from the circuit. The second type is a non-volatile storage element in which the information is preserved even if power is removed. Typically, the types of transistor devices used to provide non-volatile storage are substantially different from those used in ordinary logic circuitry or in volatile storage, thereby requiring different fabrication techniques. Hence, if non-volatile storage is included on an integrated circuit fabricated using conventional CMOS technology, chip size and complexity are undesirably increased.

Thus, heretofore it has not possible to include non-volatile storage on a integrated circuit chip formed exclusively using standard low voltage CMOS transistor devices.

SUMMARY

In accordance with this invention, non-volatile storage is provided on an integrated circuit in which all the transistors on the chip, both the logic or other circuitry and also the non-volatile storage elements, are low voltage standard CMOS devices. ("Device" used herein refers generically to a transistor or other circuit component, such as a capacitor or diode.) This is useful, for instance, in a field programmable gate array (FPGA) for storing on-chip non-volatile information, such as a decryption code or an identification number. Such an identification number might be used for "binning" integrated circuit chips during manufacture, i.e. to sort them by performance ranges. While the present invention is most useful where there is a need for a relatively limited amount of storage on an integrated circuit which is largely devoted to other purposes, the invention is not so limited. Thus, while a typical application is to store approximately 1,000 bits of information or less on an FPGA, this invention is generally applicable to non-volatile storage of information on an integrated circuit.

Therefore, in accordance with this invention, an integrated circuit formed of low voltage CMOS devices including logic (such as an FPGA), also includes at least one non-volatile storage element. This non-volatile storage element is, unlike prior art non-volatile storage elements, one or more low voltage devices in terms of its structure, i.e. has the structure of a standard low voltage CMOS diode, and hence can be fabricated in the same steps as the remaining transistors on the integrated circuit, thereby reducing cost and complexity. In one embodiment, the storage element has a gate oxide thickness of between approximately 70 Å and 100 Å, and an operating voltage (for read operations) of between approximately 3.3 volts and 4 volts, although this is not limiting.

In one embodiment of the present invention, the non-volatile storage element is a single device which, while having the structure of a transistor, is connected to be a capacitor, i.e. its source and drain terminals are connected to ground and its gate terminal connected to the control terminal (programming terminal) of the storage element. Hence, this is a one-time programmable storage device which is programmed by being blown (its gate oxide ruptured) by a high voltage programming signal applied to the control (programming) terminal. Because this is a one-time programmable storage element, in its unblown state it is non-conductive (a capacitor), and in its blown state it is shorted (conductive).

In another embodiment, the storage element, while non-volatile, is not one-time programmable, but is erasable programmable, i.e. an electrically erasable and programmable read only memory (EEPROM) cell. In one embodiment, this cell includes two floating gate transistors cross-coupled in a latch which are programmed by having a high voltage applied to the floating gates. In another embodiment, the EEPROM cell has two single polycrystalline silicon EEPROMs cross-coupled in a latch where each portion is a transistor having its gate coupled to a capacitor.

Such non-volatile storage elements require a relatively high programming voltage, in addition to the usual lower operating voltage (e.g. for reading). In one embodiment, the high programming voltage is provided from a source external to the integrated circuit, i.e. via an integrated circuit pin (terminal). In another embodiment, an on-chip charge pump circuit is connected to the programming circuitry to provide the high (e.g. 10 volt) programming voltage. This on-chip charge pump itself is fabricated from low voltage CMOS devices, and thus is compatible with the remainder of the circuitry on the integrated circuit. The charge pump, in addition to including the conventional set of stages wherein each stage is a capacitor driving a series connected diode, also includes in each stage a second capacitor series, connected between the first capacitor and the diode, to provide the desired high voltage. All of these devices, i.e. the two capacitors and the diode in each stage, are low voltage CMOS devices. Hence, a high voltage charge pump is provided from low voltage CMOS devices for on-chip use.

In accordance with the invention, there may be only a single storage element on an integrated circuit. Typically, there are more, e.g. 8, 16, 32 etc. In one embodiment the storage elements are arranged in a 32 by 32 array, thereby providing 1024 bits of information storage. Of course, this is merely exemplary. Thus, a generic storage array of the present invention is an N by M storage array, wherein N and M are each greater than one, arranged in rows and columns. The storage array shares programming and read (output) circuitry and is addressed by conventional word lines/bit lines typically used in other types of memory arrays.

DETAILED DESCRIPTION

1. Non-Volatile Storage Elements

Figure 1:
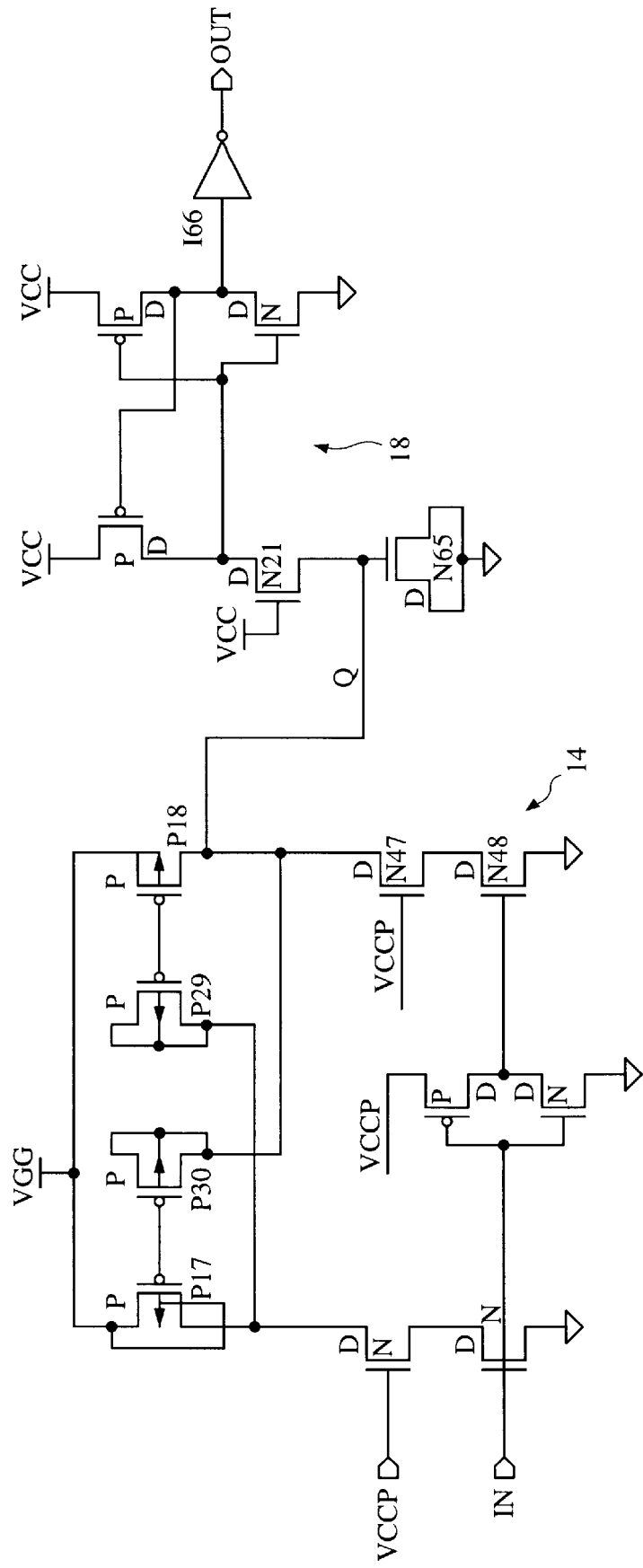
FIG. 1 shows a one-time programmable non-volatile storage element and associated circuitry in accordance with this invention.

FIG. 1 shows schematically a storage circuit, in accordance with one embodiment of this invention, which provides non-volatile storage compatible with standard CMOS integrated circuit fabrication technology, for use in an integrated circuit. It is to be understood that only the storage and associated circuits are shown in FIG. 1; the remainder of the integrated circuit is conventional and therefore is not shown. The remainder of the integrated circuit can take many forms: for example, an FPGA, an ASIC, or any other type of integrated circuit. The chief advantage of the presently disclosed storage circuits is that they are compatible in terms of their device structures with standard low voltage CMOS devices. Hence, these storage circuits can be fabricated using the same steps as those used for standard low voltage CMOS devices. In one embodiment, the present storage elements are compatible with standard low voltage CMOS technology using 0.35 $\mu$m minimum feature size in a device with a 70 Å gate oxide thickness operating at a low voltage of 3.3 volts.

FIG. 1 illustrates a first storage circuit in accordance with the invention including a storage element N65. As shown, storage element N65 is a conventional N-channel (NMOS) device in terms of structure. However, its drain (D) and source (other current handling terminal) are coupled together and connected to ground, whereas its gate terminal is connected to node Q. Note that the circuit devices shown in FIG. 1 and the following figures are designated conventionally, i.e. P designates a PMOS device and N designates an NMOS device. (Conventional structures shown in the drawings, e.g. certain transistors and other devices and circuit elements, are not described herein and do not have reference numbers in the drawings.) The circuitry 14 to the left of storage element N65 in FIG. 1 is the input (programming) circuitry and the circuitry 18 above and to label the right of storage element N65 is the output (read) circuitry. VGG designates both the programming voltage and the terminal where this voltage is supplied, either from an external source or generated internally from a charge pump as discussed further below.

A standard operating voltage (3.3 volts) is supplied at terminal VCC. VCCP is the voltage supply terminal for programming. Terminal IN receives the signal indicating that storage element N65 is to be programmed. In the non-programmed state, storage element N65 is intact, and hence is non-conductive, i.e. node Q is not shorted to ground. However, when storage element N65 is programmed, it is "blown" (its gate oxide ruptured) so that node Q is shorted to ground. Hence, storage element N65 is a one-time programmable storage element.

In operation prior to programming, with the programming circuit disabled, terminals VCCP and VGG are both at 0 volts. The circuit is powered up by 3.3 volts applied to terminal VCC. Hence, the output signal at terminal OUT is always 1 because node Q is floating. By enabling the programming circuit with terminals VCCP and VGG both at 3.3 volts, the circuit operation is checked by supplying a logical 0 at the IN terminal and obtaining a logical 0 at the OUT terminal. (It is to be understood that the reference to logical 0 and logical 1 herein refer to 0 volts and 3.3 volts respectively, assuming standard 3.3 volt operation.)

During programming, in order to program this storage circuit to give an output signal of logical 0 at terminal OUT, the signal applied to terminal IN is set to logical 1. Initially, the VCCP terminal voltage is set to 3.3 volts and VGG is also set to 3.3 volts to enable the programming circuit. Then, with the signal at terminal IN still set to logical 1, voltage VGG is taken from 3.3 volts to the high programming voltage HV, e.g. 10 volts. Then, the combination of device P17 (connected as a transistor) and device P30 (connected as a capacitor) acts as a high voltage P-channel device. Similarly, the combination of devices P29 and P18 acts as a high voltage P-channel device. For additional details regarding the structure and fabrication of these high voltage devices, see U.S. Pat. application Ser. No. 08/826,450 entitled "A High Voltage Device with Low Voltage Process", invented by Voogel et al., filed on Mar. 27, 1997, and incorporated herein by reference. Then, the voltage at node Q goes to voltage HV. Transistor N47 with its gate terminal connected to the voltage at terminal VCCP protects transistor N48 from high voltage breakdown from the imposed high voltage HV. Thus, the high voltage HV at node Q, instead breaks down (ruptures) the gate oxide of storage element N65, thereby creating a conductive path from the gate terminal of storage element N65 to ground.

During this programming operation, all the other devices in this storage circuit are protected from breakdown, i.e. not exposed to the high voltage HV. For example, transistor N21 has voltage (HV-VCC) across its gate. The end of programming is detected by an increase in current from the VGG power supply, as node Q is grounded and the output of the storage circuit at terminal OUT changes from logical 1 to 0.

If the circuit is desired to store a bit value of 1 (its initial condition), the signal applied to terminal IN is kept at 0 and node Q remains at logical 0, thereby ensuring that the storage circuit is not disturbed (i.e. device N65 is not blown).

After programming is completed, terminal VGG is coupled to ground and terminal VCCP, i.e. the programming supply voltage terminal, is also connected to ground. This coupling renders node Q floating so that the programming circuit does not interfere with the operation of storage element N65.

Figure 2B:
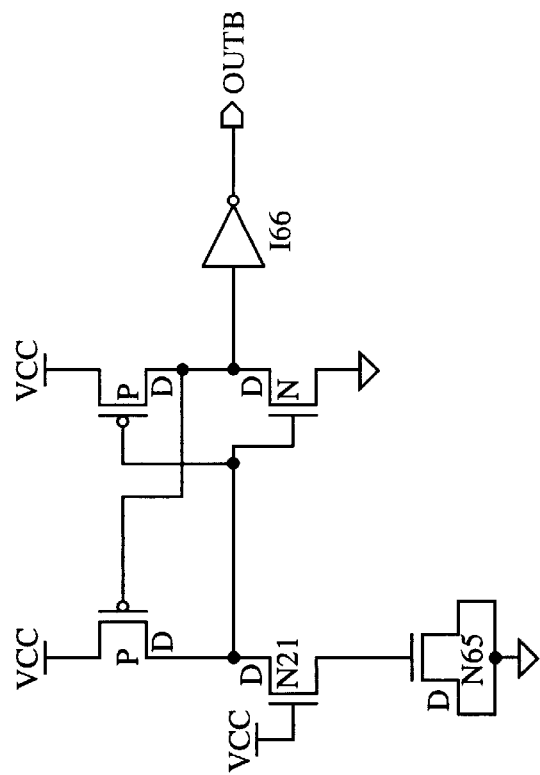
FIGS. 2A and 2B show equivalent circuits for the circuit of FIG. 1 depending on the programming state.
Figure 2A:
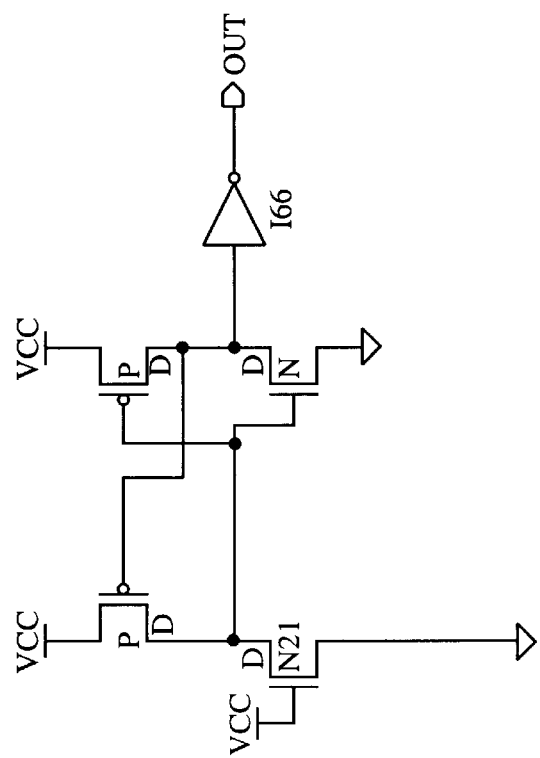

The equivalent circuits of this storage circuit with either the storage element N65 blown and connected to ground or left in its original state are shown respectively in FIGS. 2A and 2B. Hence, in FIG. 2B, the output signal is OUTB which is the inverse of the signal OUT. (The letter B or b in the figures refers to "bar" or inverse). Hence, with storage element N65 blown and hence shorted to ground, signal OUT is always logical 0. With storage element N65 in its original unblown state, signal OUT is always logical 1, which is the initial condition.

Note that in FIG. 1 and the following figures, the N-well (body) contacts for certain of the devices, e.g. P17, P30, P29, P18, are shown. This arrangement ensures that none of the well parasitic diodes are forward biased.

Figure 3:
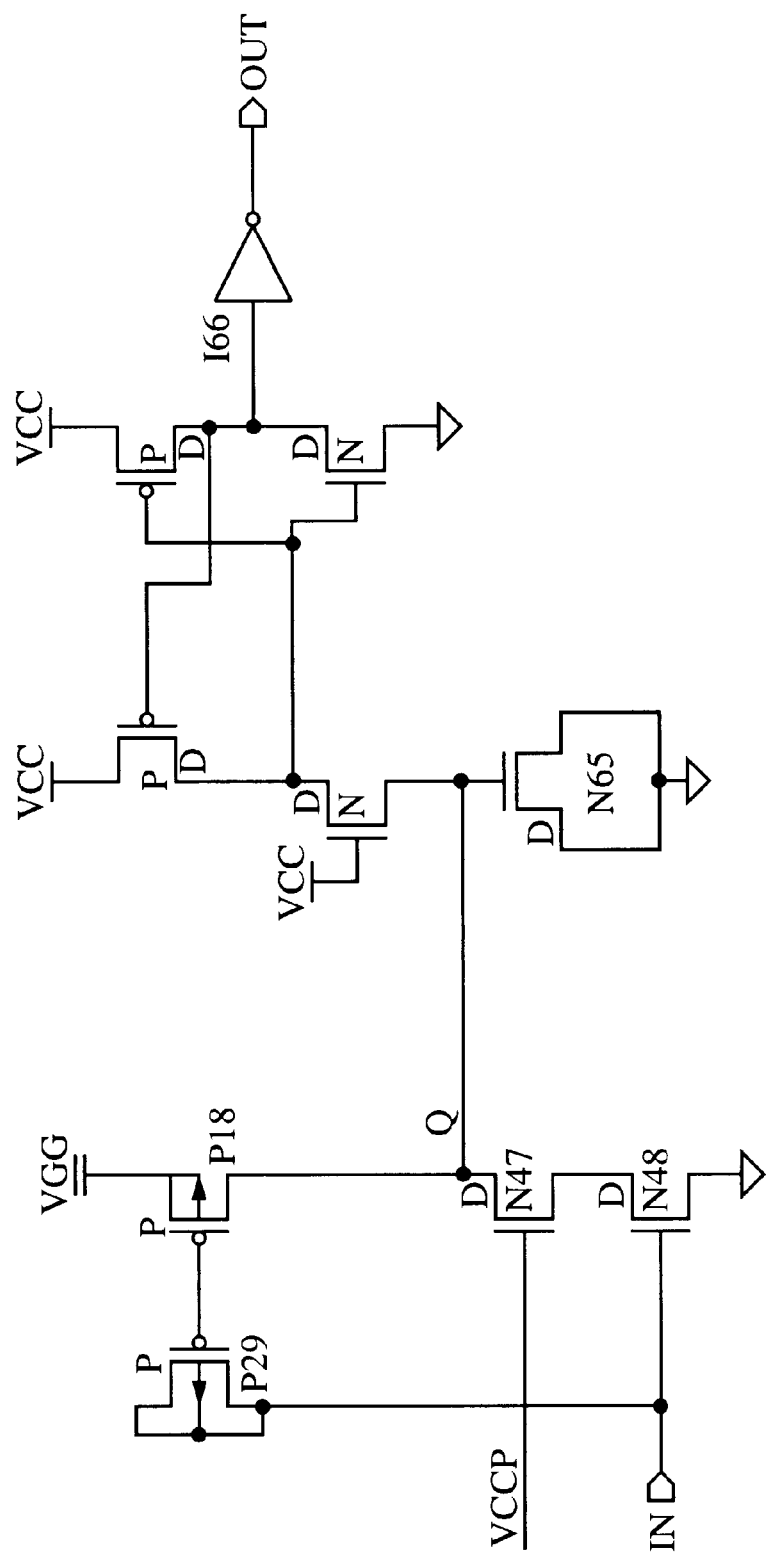
FIG. 3 shows an alternative version of the circuit of FIG. 1.

Another embodiment of the circuit is shown in FIG. 3. Note that storage element N65 is the same as in FIG. 1. During the programming mode, if the signal applied to terminal IN is 0 and terminals VCCP and VGG are both at 3.3 volts, then node Q is at 3.3 volts. The voltage applied to terminal VGG is taken from 3.3 volts to the high voltage HV, i.e. 10 volts. The combination of devices P29 and P18 again acts as a high voltage P-channel device. Then, the signal at node Q goes to the programming voltage HV. Transistor N47, with its gate coupled to programming supply terminal VCCP, protects transistor N48 from high voltage breakdown during programming. The high voltage on node Q breaks down the gate oxide of storage element N65, creating a conductive path from the gate of storage element N65 to ground. Again, the end of programming is detected by an increase of current from the VGG supply, as node Q is grounded and the output of the storage circuit at OUT changes from logical 1 to 0.

With the signal applied to terminal IN equal to 1, the voltage at node Q is 0 and the storage circuit is not disturbed. This is a condition used to store the 1 bit (the initial unprogrammed condition). One difference between this circuit and that of FIG. 1 is that in this state there is current consumption from terminal VGG if the voltage at VGG is more than VCCP+$V_{TP}$, wherein $V_{TP}$ is the P-channel threshold.

The circuits of FIGS. 1 and 3 are one-time programmable. However, in other circumstances, a multi-time programmable non-volatile storage element is desirable. Hence, the circuit of FIG. 4 uses a flash EEPROM cell (storage element) as the storage element. See U.S. Pat. No. 5,523,971, issued Jun. 4, 1996 to Rao, incorporated herein by reference in its entirety, describing such a flash EEPROM cell. The flash EEPROM cell includes two EEPROM transistors N68/N69 connected in a latch configuration with complementary program and erase states. Thus, either transistor N68 is programmed and transistor N69 is erased or transistor N68 is erased and transistor N69 is programmed.

Figure 4:
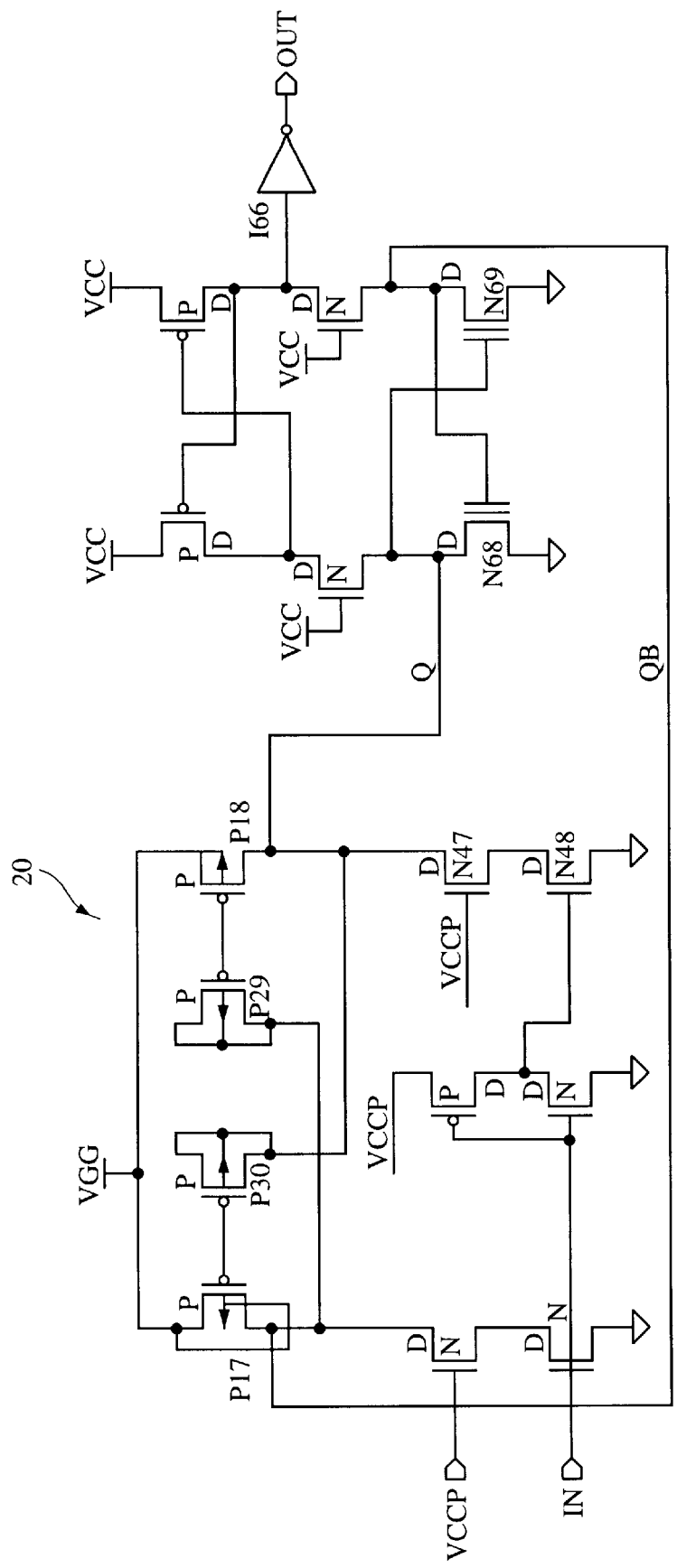
FIG. 4 shows an EEPROM non-volatile storage element with two floating gate cross-coupled storage devices and associated circuitry in accordance with this invention, using floating gate transistors.

Transistors N68 and N69 are shown having the double gate symbol to indicate the presence of a floating gate and a control gate. Hence, these are special EEPROM transistors. Such floating gate transistors N68 and N69 are fabricated by a conventional self-aligned double polysilicon layer extension of the standard CMOS fabrication process, as described in the above-referenced patent. Hence, the circuit of FIG. 4 is not strictly speaking implemented in a standard CMOS process, but requires additional steps to fabricate the floating gates of transistors N68 and N69.

Operation of the circuit of FIG. 4 prior to programming is as follows. By enabling the programming circuit with the voltages at terminals VCCP and VGG both equal to 3.3 volts, the circuit operation is checked by putting a logical 0 value signal at terminal IN and obtaining a logical 0 output value at output terminal OUT. A logical 1 at terminal IN provides a logical 1 at terminal OUT. Without the programming circuit enabled, the state of the signal at terminal OUT is undetermined since both transistors N68 and N69 are in a neutral state.

To program this storage circuit to give an output of (logical) 0, floating gate transistor N69 is programmed by charging its floating gate with electrons, giving it a high threshold voltage ($V_T$). The other floating gate transistor N68 must be erased so its floating gate is discharged of electrons, thereby giving it a low threshold voltage $V_T$. This programming/erasing is accomplished by setting the signal applied to terminal IN to be (logical) 1 and taking the programming voltage on terminal VGG to a high voltage HV, e.g 10 volts. Initially, the programming supply voltage on terminal VCCP is set at 3.3 volts and the programming voltage on terminal VGG is also set at 3.3 volts. The signal applied to terminal IN is set to logical 1, and the programming voltage on terminal VGG is taken from 3.3 volts to the high voltage (HV).

The combination of devices P17 and P30 acts like a high voltage P-channel device, as does the combination of devices P29 and P18. Node Q then goes to the high voltage HV and node QB (having the inverse of the signal at node Q) goes to 0 volts. Transistor N47, with its gate connected to the programming supply voltage on terminal VCCP, protects transistor N48 from high voltage breakdown during programming. Floating gate transistor N68 has a high voltage applied to its drain (connected to node Q), and 0 volts applied to its gate from node QB. This configuration erases the floating gate transistor N68, making its threshold voltage low. The other floating gate transistor N69 has a high voltage applied to its gate from node Q and 0 volts applied to its drain from node QB. This configuration programs floating gate transistor N69, making its threshold voltage $V_T$ high. During this programming operation, the other devices shown in the circuit of FIG. 4 are protected from breakdown, i.e. shielded from the application of the high programming voltage at terminal VGG. Transistor N21 has voltage (HV-VCC) applied to its gate.

With the signal logical 0 applied to terminal IN, floating gate transistor N68 is programmed and floating gate transistor N69 is erased.

After programming, terminals VGG and VCCP are connected to ground, thereby disabling programming circuit 20 and floating node Q so that programming circuit 20 does not interfere with the operation of the storage circuit (which includes floating gate transistors N68 and N69). With transistor N68 erased and transistor N69 programmed, the input node to an output inverter I66 is at logic value 1, thereby providing a logic value 0 at terminal OUT. With the floating gate transistor N68 programmed and floating gate transistor N69 erased, the input node to inverter I66 is at logic 0, thereby providing a logic 1 at terminal OUT.

Figure 5:
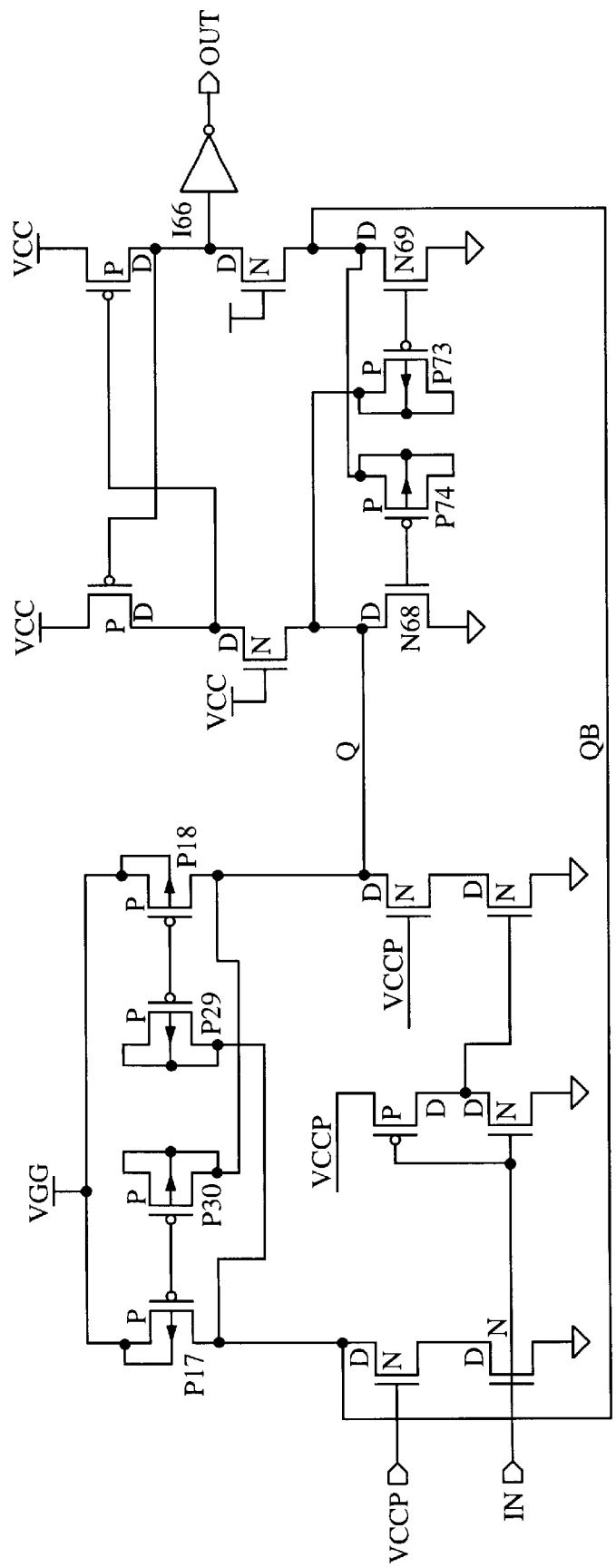
FIG. 5 shows another EEPROM version of the circuit of FIG. 4 with two storage portions, each including an access transistor and storage capacitor, using standard CMOS transistors.

In accordance with another embodiment in the invention, the floating gate transistors of FIG. 4 are replaced with devices fully compatible with a standard CMOS fabrication process. Referring to FIG. 5, transistors N68 and N69, while similarly labelled to those in FIG. 4, differ because they are not floating gate transistors but are standard low voltage NMOS transistors. In this embodiment, each of the two portions of the EEPROM cell includes an additional device. Device P74 is a PMOS device connected as a capacitor with its "gate" terminal connected to the gate terminal of transistor 68. Similarly, device P73 is a PMOS device connected as a capacitor with its "gate" terminal connected to the gate terminal of transistor N69. Thus, transistors N68 and N69 are standard single polycrystalline silicon layer transistors (having no stacked gate structure). The size of transistors N68, N69 ensures that the coupling ratio in each portion of the EEPROM cell is optimized to be greater than 70%, so that F-N (Fowler-Nordheim) tunnelling takes place during programming and erasing of the cells. Hence, transistor N68 has the minimum channel length (e.g. 0.35 $\mu$m) with a channel width of 1 $\mu$m, whereas associated device P74 has a channel width and length of 3 $\mu$m. These dimensions provide one way to establish the desired coupling ratio of greater than 70% between the gate terminals of devices N68 and P74. An identical size ratio exists between devices N69 and P73.

The EEPROM cell of FIG. 5 is in some ways similar to that disclosed in U.S. Pat. application Ser. No. 08/816,100 entitled "CMOS Flip-Flop Having Non-Volatile Storage" invented by F. Erich Goetting and Scott O. Frake, filed Mar. 14, 1997, and incorporated herein by reference. However, that EEPROM cell uses hot electron injection and has a thick gate oxide (greater than 100 Å), whereas in accordance with the present invention the EEPROM cell does not use hot electron injection and has a thinner gate oxide, as described above.

FIGS. 6 through 11 show auxiliary logic circuits for use in conjunction with the circuits of FIGS. 1, 3, 4, and 5. These auxiliary logic circuits are high voltage logic gates for implementing a particular function in terms of inversion, NAND, or NOR logic. Use of such logic gates will be apparent below; see e.g. FIGS. 10–16 and 18–22.

Figure 6:
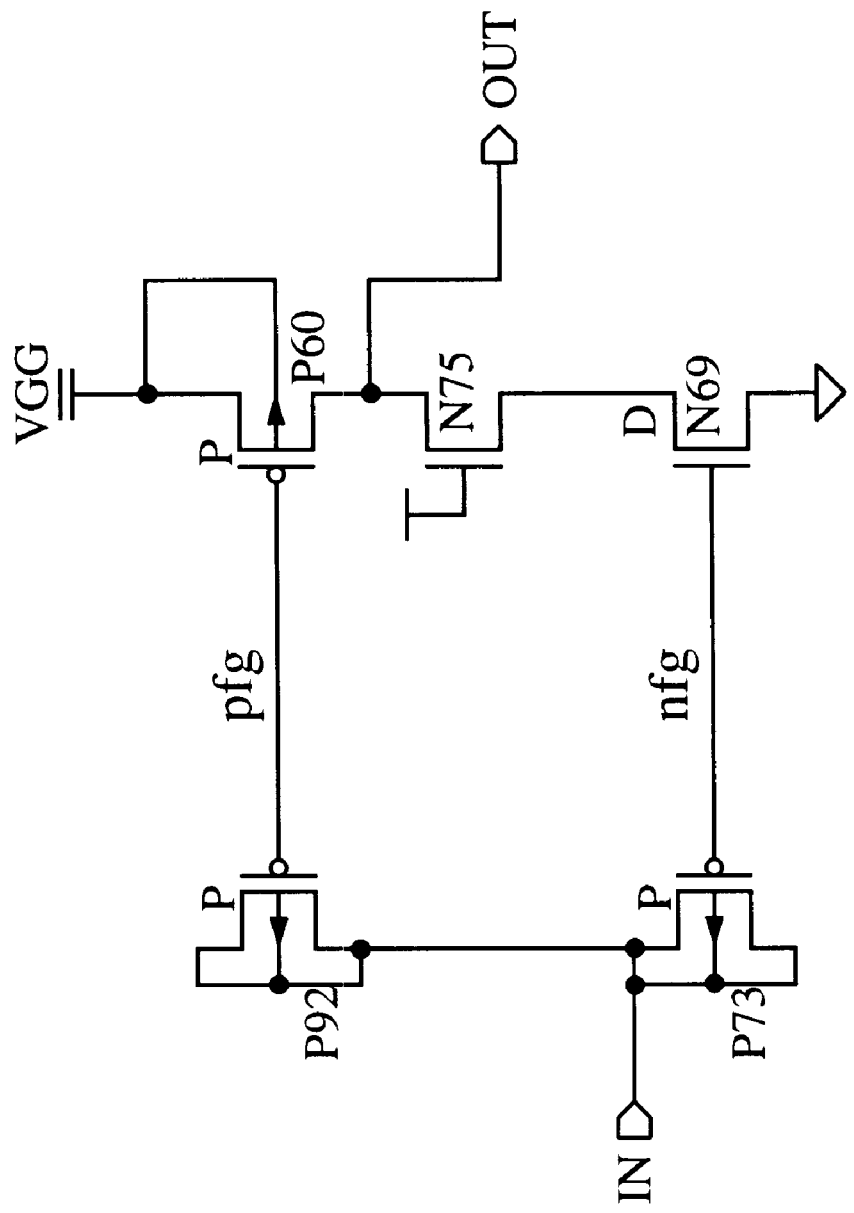
FIG. 6 shows an inverter for use with the circuit of FIG. 5.

FIG. 6 shows a high voltage inverter which operates as a standard CMOS type inverter with a standard operating voltage provided on terminal VGG (3.3 volts for typical 0.35 $\mu$m technology). This circuit continues to operate like an inverter even with a programming voltage on terminal VGG equal to 10 volts and a changing input signal, i.e. the signal applied at terminal IN may change from 0 volts to 10 volts. The combination of device P73 (connected as a capacitor) and transistor N69 protects the gate of pull-down transistor N69 from high voltage. In a similar manner, the combination of device P92 (connected as a capacitor) and transistor P60 protects the pull-up transistor P60 from high voltage. In high voltage operation, both nodes pfg and nfg experience a voltage halfway between 0 volts and programming voltage VGG. This result is achieved by choosing the appropriate coupling ratio.

If the voltage on terminal VGG is taken from 3.3 volts to 10 volts, because of the drain/gate overlap capacitance of device P60 and the overlap capacitance between devices P92 and P60, the voltage of node pfg is raised so that device P60 is not in breakdown region. Note that to protect device N69 when the voltages on terminals IN and OUT are 0 and 10, respectively, device 75 is provided.

If input terminal IN is at logic zero, the signal at terminal OUT goes from 3.3 volts to 10 volts. This change also increases the voltage at node nfg because of the gate/drain overlap capacitance of device N69 and the overlap capacitance between devices P73 and N69. If the voltage at input terminal IN is 3.3 volts and is increased to 10 volts, the change on terminal IN increases the pfg and nfg node voltages.

Figure 7:
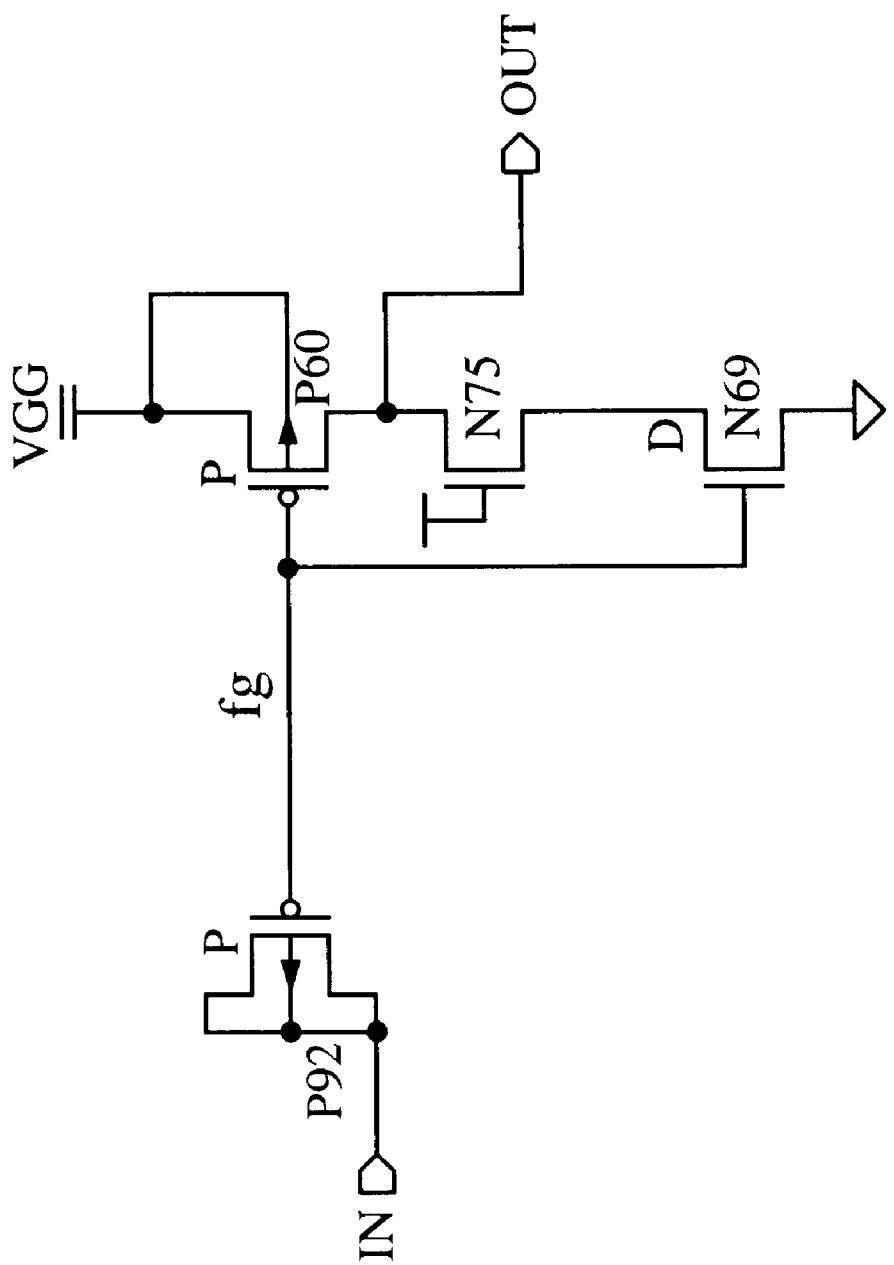
FIG. 7 shows another inverter for use with the circuit of FIG. 5.

A variation of the high voltage inverter of FIG. 6 is shown in FIG. 7 where devices P73 and P92 of FIG. 6 are effectively combined. Note that once again to protect device N69 when voltages on terminals IN and OUT are 0 and 10, respectively, device 75 is provided. A limitation of these circuits is that current flows in this circuit when the signal at terminal OUT is low voltage (logic 0) because pull-up device P60 is conducting. These circuits are used only during programming, where a power supply or a charge pump delivers the total current used by the programming circuit. In the read operation, these inverter circuits are disabled by setting the voltage on terminal VGG to be zero.

Figure 8:
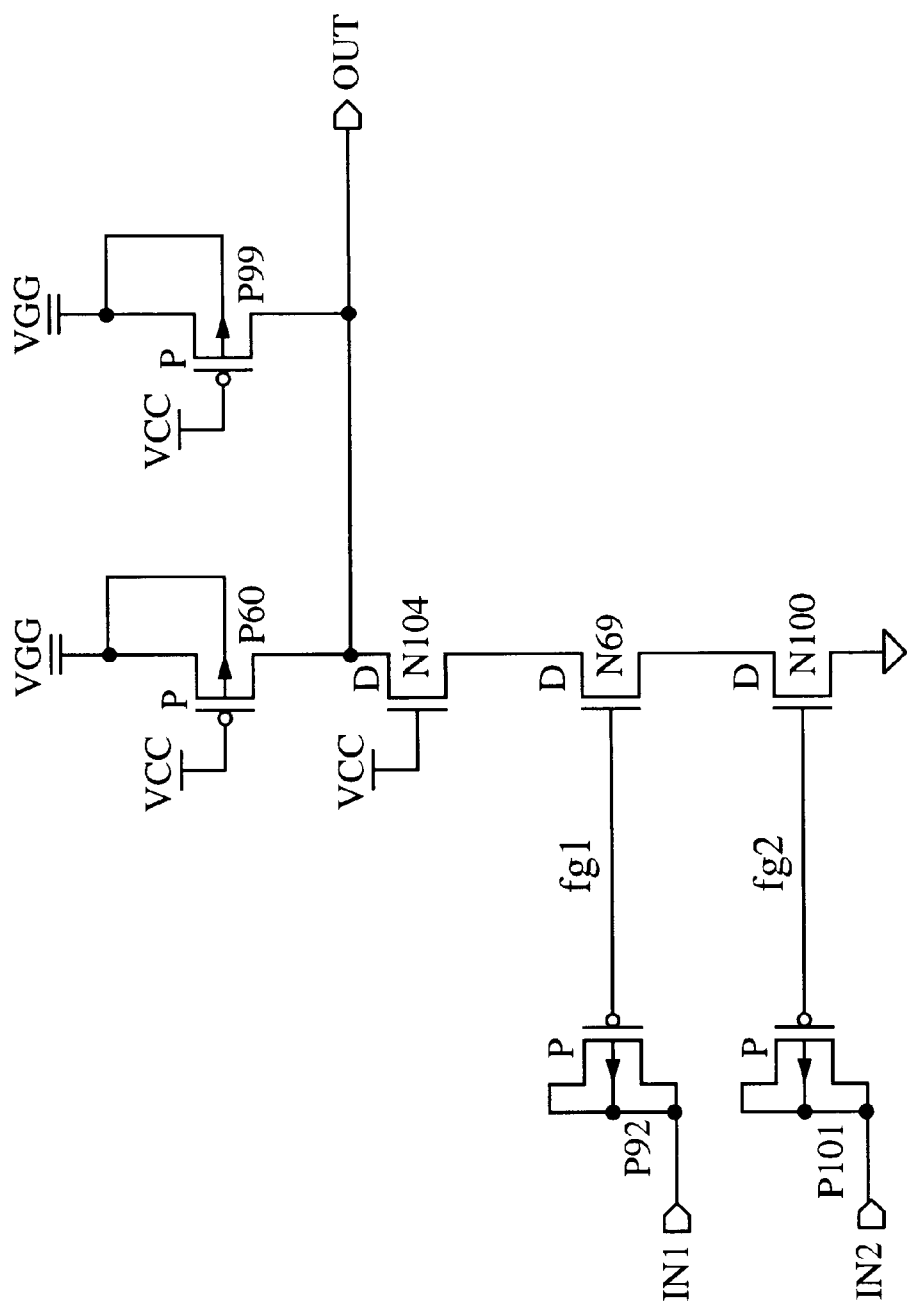
FIG. 8 shows a NAND gate for use with the circuit of FIG. 5.

FIG. 8 shows a high voltage NAND gate in accordance with this invention used for high voltage logic during programming. The circuit shown in FIG. 8 logically operates like any NAND gate to combine the signals at terminals IN1 and IN2 to provide a logical output signal at terminal OUT. P-channel devices P60 and P99 have their gates connected to terminal VCC. This connection protects these gates from breakdown since these gates will be only exposed to voltages at VGG-VCC or at voltage VCC rather than the full value of voltage on terminal VGG. NMOS devices N69 and N100 have their gates coupled to capacitor-connected devices P92 and P101, respectively. NMOS devices N69 and N100 are connected to terminal OUT via transistor N104 which has its gate connected to the voltage supply terminal VCC.

Figure 9:
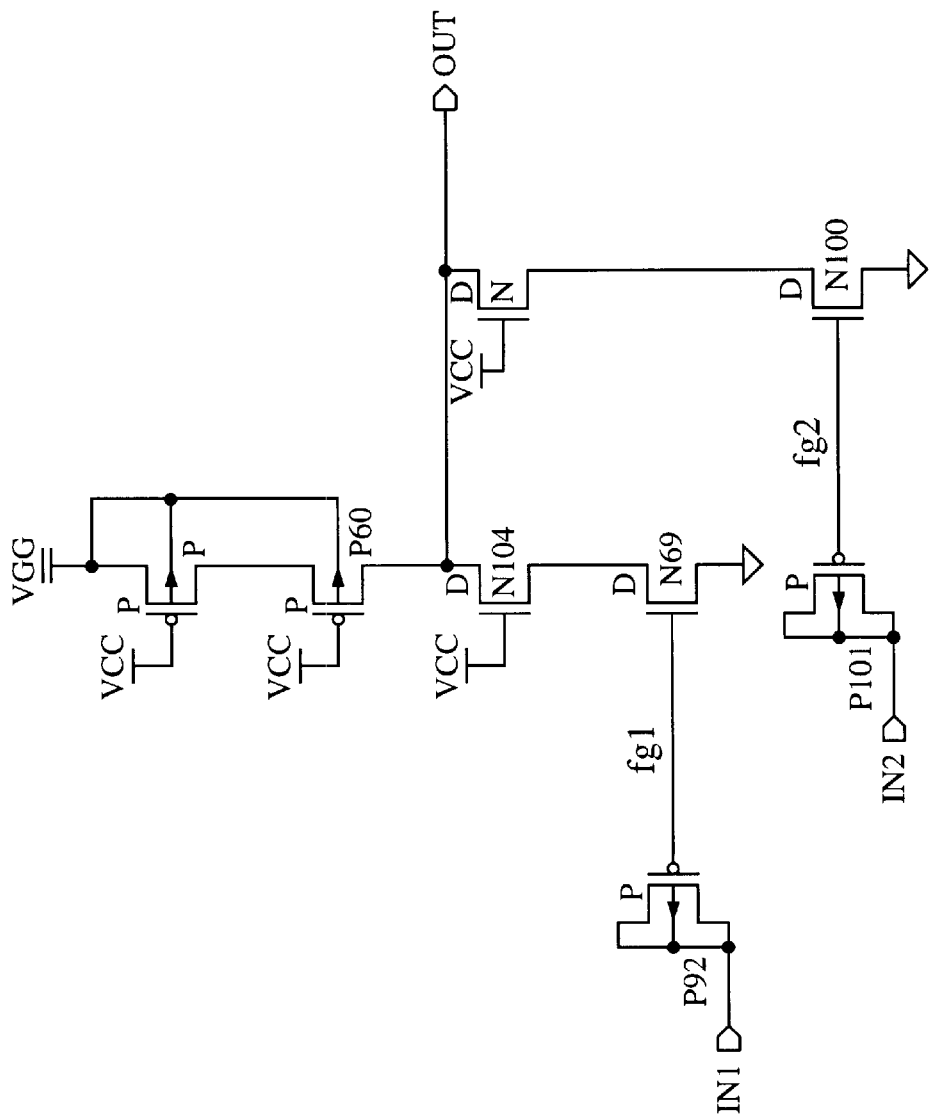
FIG. 9 shows a NOR gate for use with the circuit of FIG. 5.

A somewhat similar structure is shown for a NOR gate in FIG. 9 with similar provisions made for protecting the gates of both the P channel and N channel devices from breakdown during programming. The NOR gate of FIG. 9 logically combines the signals at terminals N1 and N2 to provide a logical output signal at terminal OUT.

2. Memory Array Using Gate Breakdown Device FIGS. 1, 3, 4, and 5 show storage circuits each having a single storage element. Typically, in any one integrated circuit, as described above, it is useful to have a number of storage elements. Rather than replicating the circuit of, for example, FIG. 1 N times to have N storage elements, the present invention provides a memory array which includes N by M storage elements arranged in M columns and N rows, M and N each being at least 1. Memory arrays are well known and hence not described in extensive detail herein in terms of actual operation.

Figure 10:
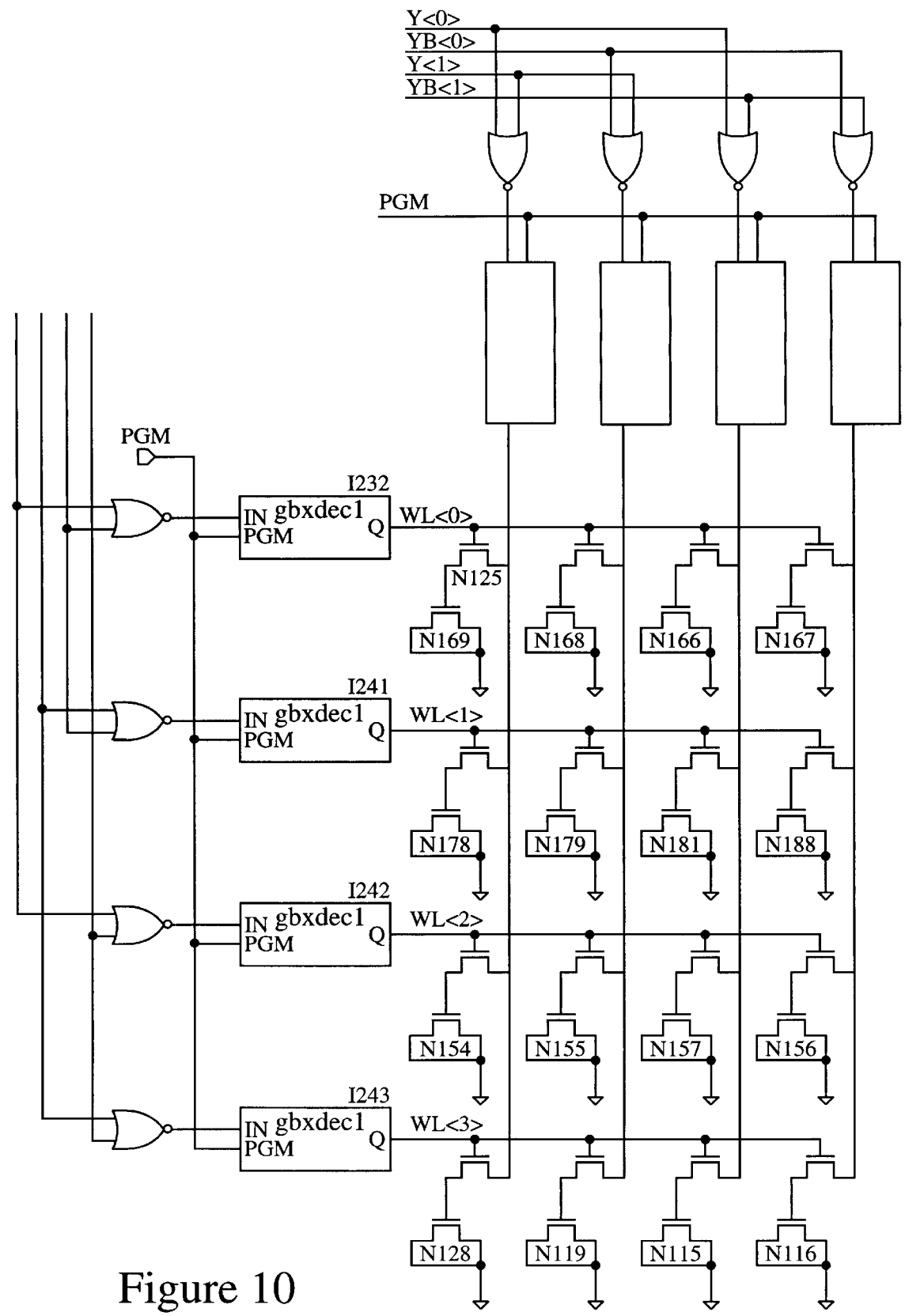
FIG. 10 shows an array of non-volatile storage elements in accordance with this invention, wherein each element of the array includes an access transistor and a one-time programmable element.

FIG. 10 shows a first memory array in accordance with this invention, having 4 columns by 4 rows and 16 storage elements; this size is merely exemplary and other array sizes are possible based on the amount of data to be stored on a particular integrated circuit.

The basic storage element in this array is the gate breakdown transistor described above. In FIG. 10, transistors N128, N119, N115, N116, N154, N155, N157, N156, N178, N179, N181, N188, N169, N168, N166, N167 are the gate breakdown transistors. Each gate breakdown transistor has its drain and source terminals connected to ground and its gate terminal connected to an access transistor for addressing the associated gate breakdown transistor. For instance, the access transistor N125 is associated with gate breakdown transistor N169. The gate of each access transistor in a row is connected to a word line (WL), designated WL0 to WL3. The drain of each access transistor in a column is connected to a bit line (BL), designated BL0 to BL3. For programming purposes, the voltage of the selected wordline is set to voltage VGG and the deselected word lines are set to e.g. 1.5 volts. In a similar manner, the selected bit line is set to voltage VGG and the deselected bit lines are set to 1.5 volts. These particular voltages protect the access transistors.

In a read mode, one word line WL is selected and the bit lines BL are all biased to the supply voltage at terminal VCC. The bit lines where the gate oxide transistor is broken down will be pulled down to 0 volts.

Figure 11:
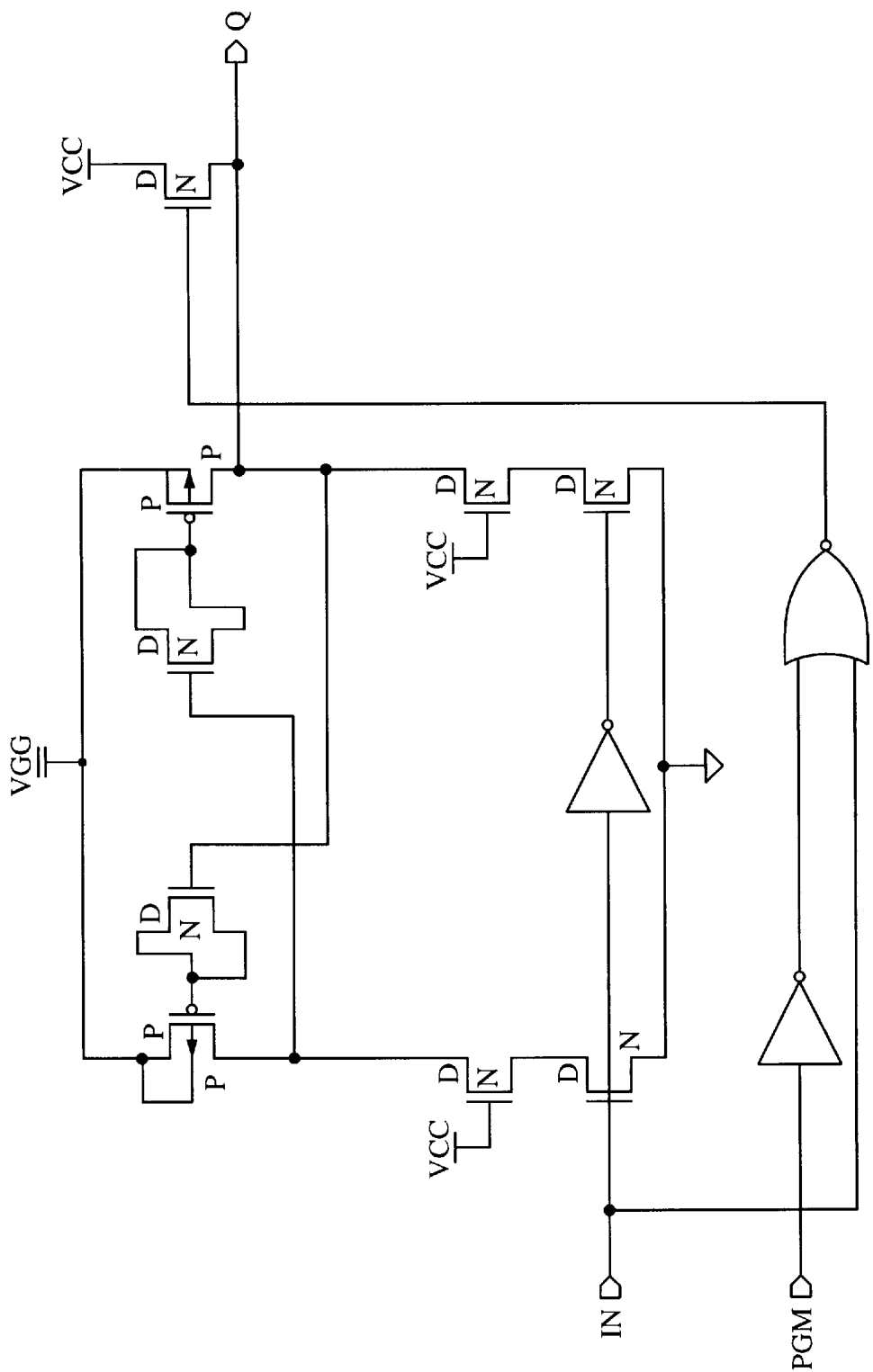
FIG. 11 shows an example of the programming circuitry for use with the array of FIG. 10 for the word lines.
Figure 12:
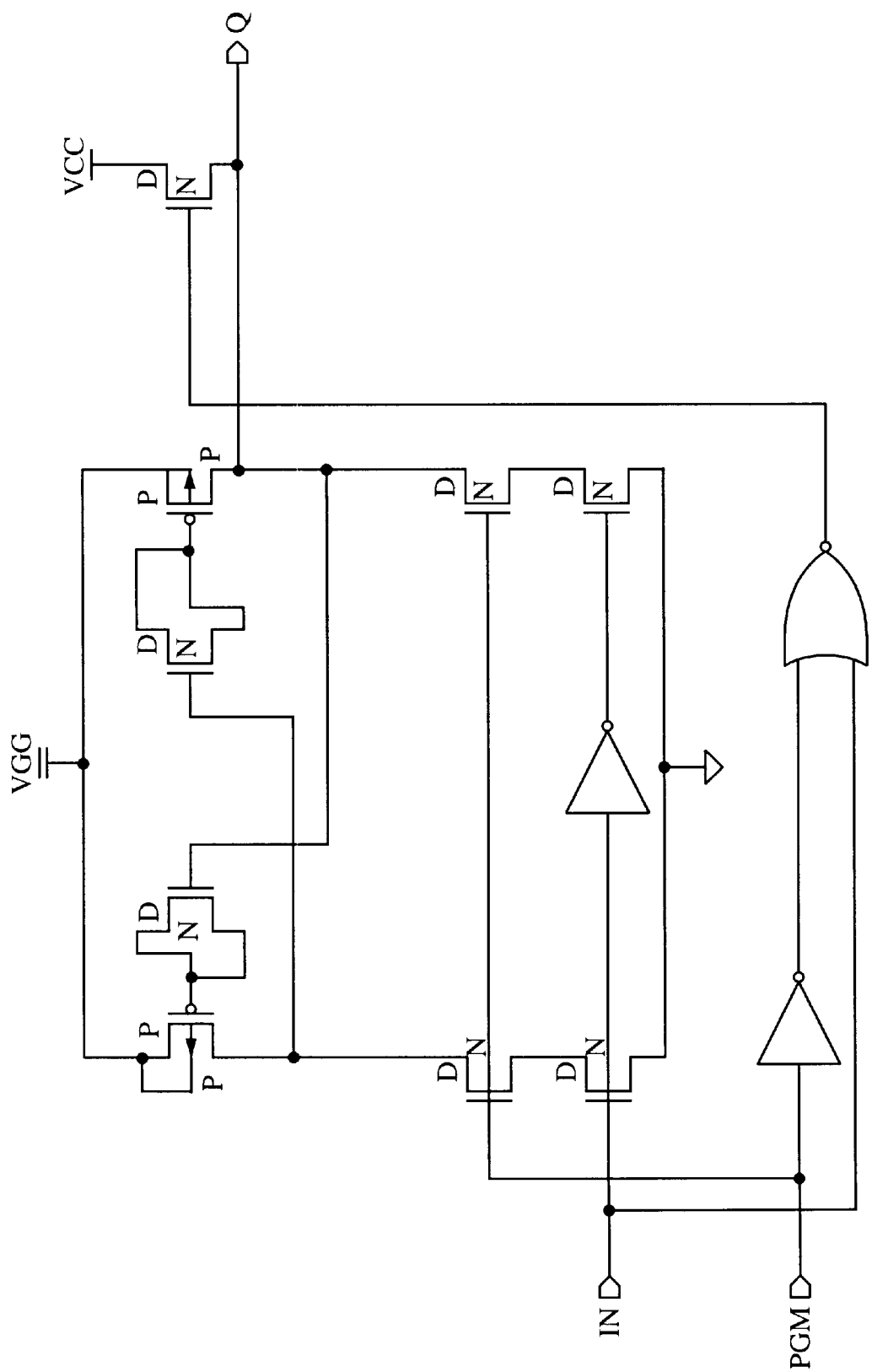
FIG. 12 shows an example of the programming circuitry for use with the array of FIG. 10 for the bit lines.

As shown in FIG. 10, the word lines are driven by a set of identical circuits (each designated gbxdec1) labeled I232, I241, I242, and I243. Detail of one such circuit gbxdec1 is shown in FIG. 11, wherein the output terminal Q is coupled to a particular word line WL. The signals which drive the bit lines are generated by a set of identical circuits (each designated gbydec1) labeled I249, I257, I258, and I259. Detail of one such circuit gbydec1 is shown in FIG. 12 wherein the output terminal Q is coupled to a particular bit line BL.

The signals to drive the word line driver circuits are provided by a signal bus which includes lines X0, XB0, X1, and XB1. Similarly, the signals to drive the bit line driver circuits are provided by a signal bus which includes lines Y0, YB0, Y1, and YB1. Note that the XB lines are merely the inverse of the particular X line and the YB lines are merely the inverse of the particular Y line. As is typical of such arrays, the program signal line PGM is driven by an external source to indicate the need to program.

The bit lines are conventionally connected to an output circuit for reading the stored data. For the selected wordlines, four bit lines are read. As stated above, in the read mode, one word line is selected and the bit lines are all biased to the supply voltage at terminal VCC. In this manner, the bit lines where the gate oxide transistor is broken down will be pulled down to 0 volts.

Figure 13:
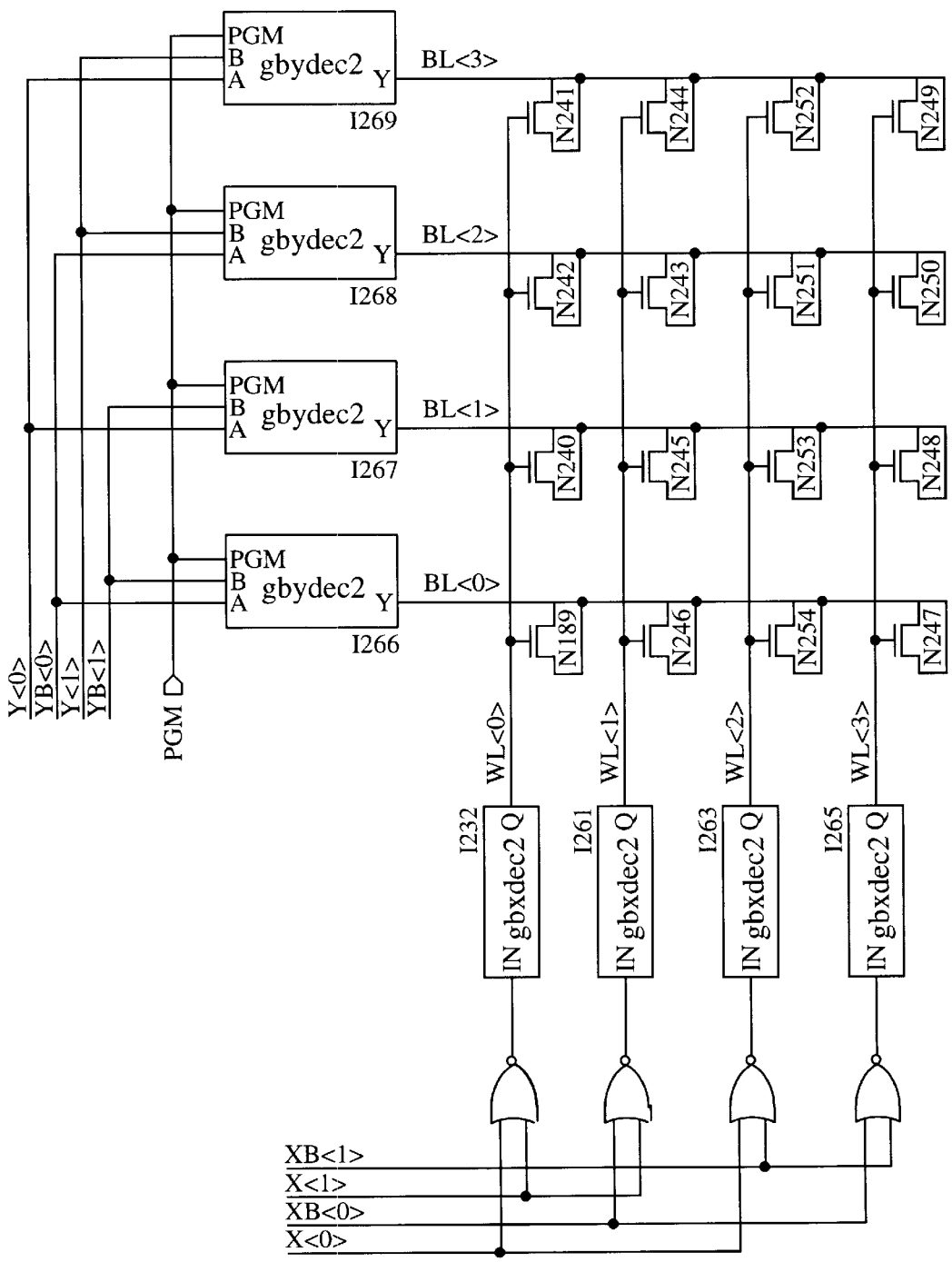
FIG. 13 shows an array of non-volatile storage elements, where each element of the array is one-time programmable, without access transistors.
Figure 14:
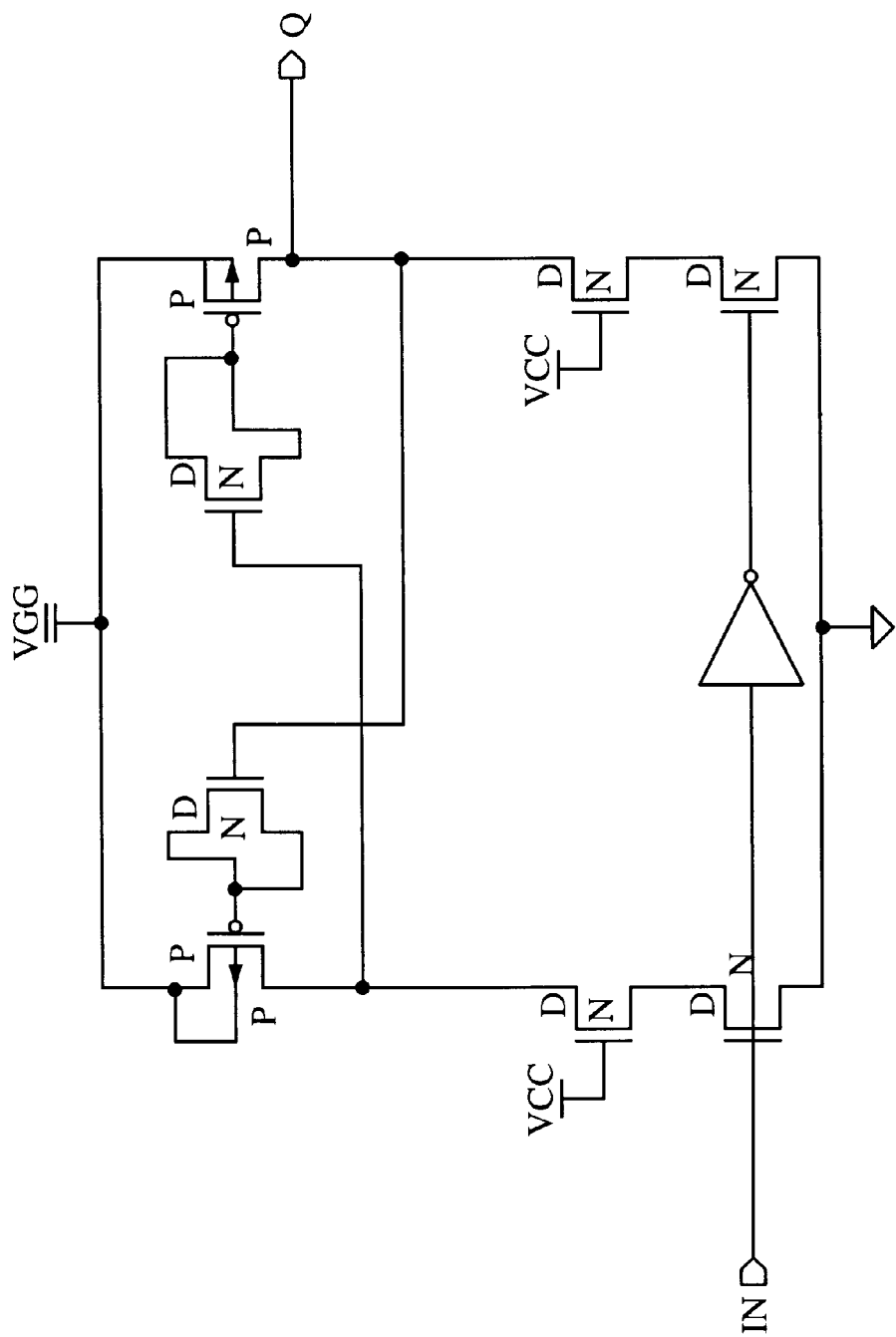
FIG. 14 shows an example of the word line programming circuitry for use with the array of FIG. 13.
Figure 15:
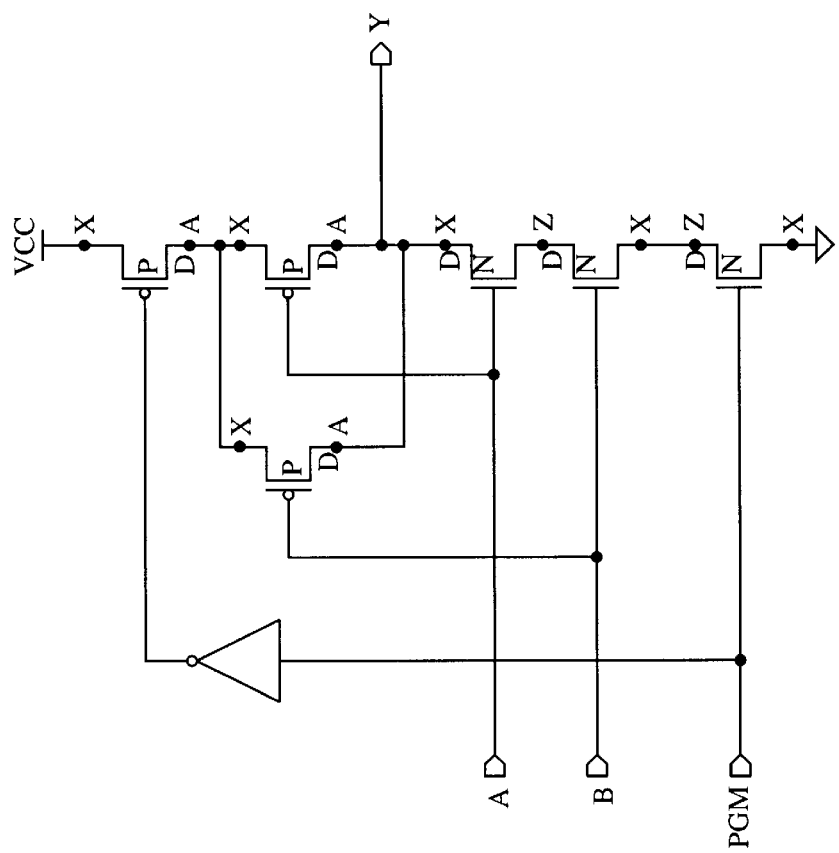
FIG. 15 shows an example of the bit line programming circuitry for use with the array of FIG. 13.

FIG. 13 shows a somewhat similar memory array using gate oxide breakdown transistors as the storage elements, but without the access transistors. In this embodiment, the gate terminal of each gate breakdown transistor is connected directly to a word line WL and its source terminal is connected directly to a bit line BL. Again, the selected word line is set to the programming voltage at terminal VGG and the deselected word lines are set to 1.5 volts. The selected bit line is set to 0 volts and the deselected bit lines are set to the voltage at terminal VCC. These voltages will break down the gate oxide of the selected transistor.

In the read mode, initially all the bit lines are at 0 volts. At the selected word line, the bit lines for the gate oxide transistors which are broken down will be pulled up to voltage VCC, thereby allowing reading of this array. The word line driver circuit gbxdec2 (which is used for each of circuits I232, I261, I263 and I265) is shown in detail in FIG. 14. The output terminal Q is coupled to a particular word line WL. The corresponding bit line driver circuit gbydec2 (which is used for each of circuits I266, I267, I268, and I269) is shown in detail in FIG. 15. The output terminal Y is coupled to a particular bit line BL.

Use of such arrays may be used for storing encryption parameters, internal chip designation values, etc. or whenever a limited amount of on-chip nonvolatile storage is desired, either during chip manufacturing or in use in the field.

3. Nonvolatile Memory Array Using EEPROM Memory Elements

Figures 16, 16A:
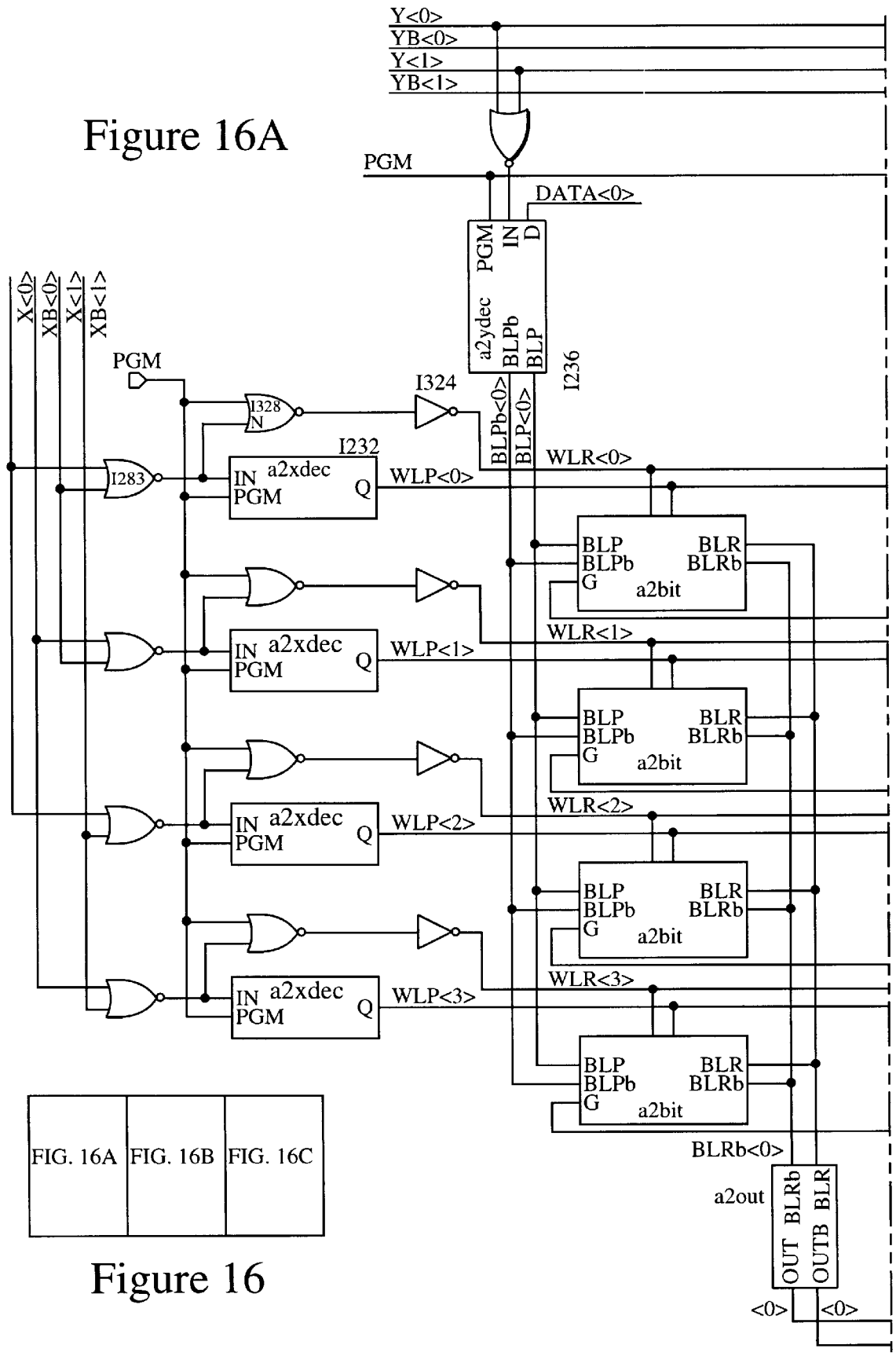
FIGS. 16A–C show an array of non-volatile storage elements in accordance with this invention where each storage element is an EEPROM cell.
Figure 16B:
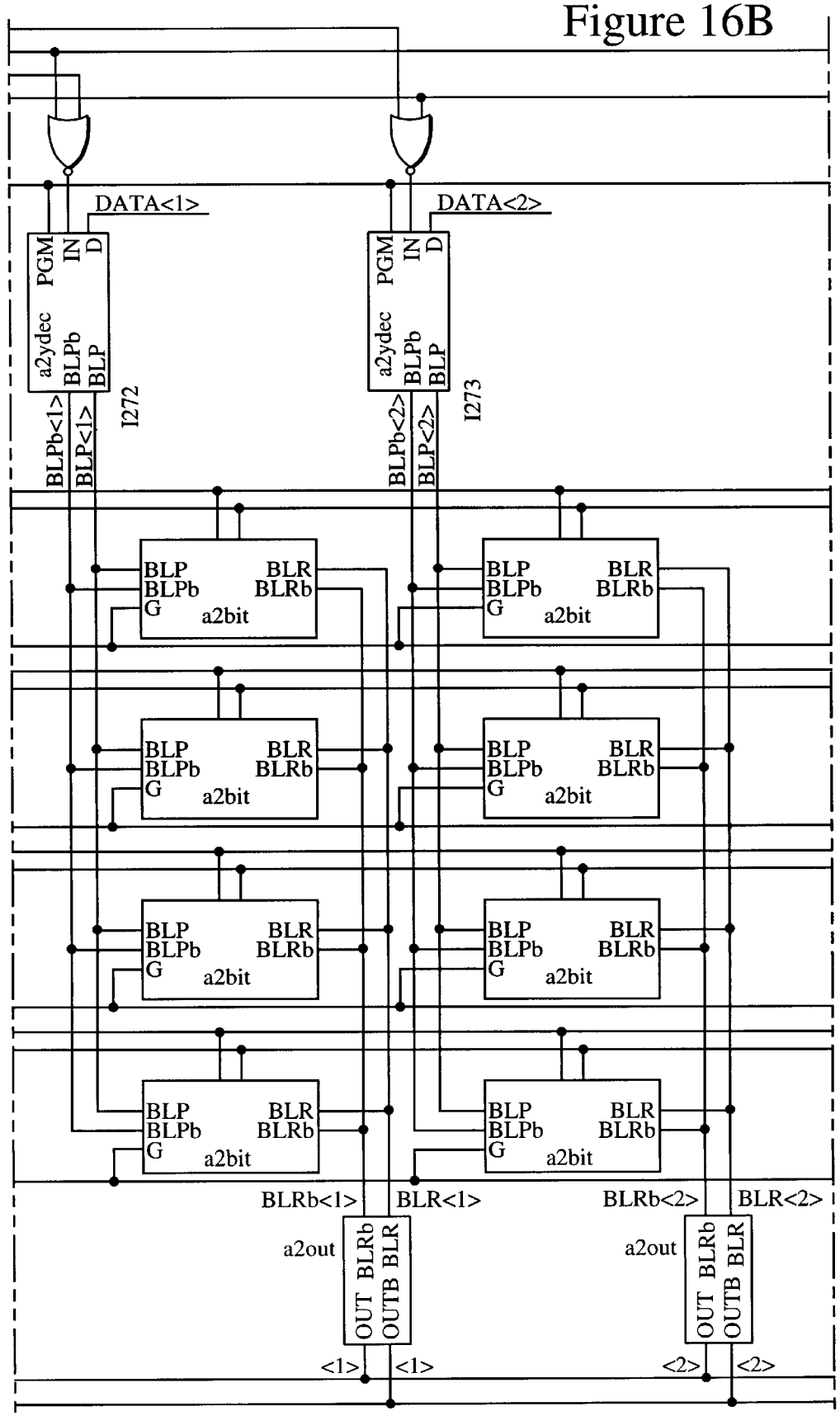
Figure 16C:
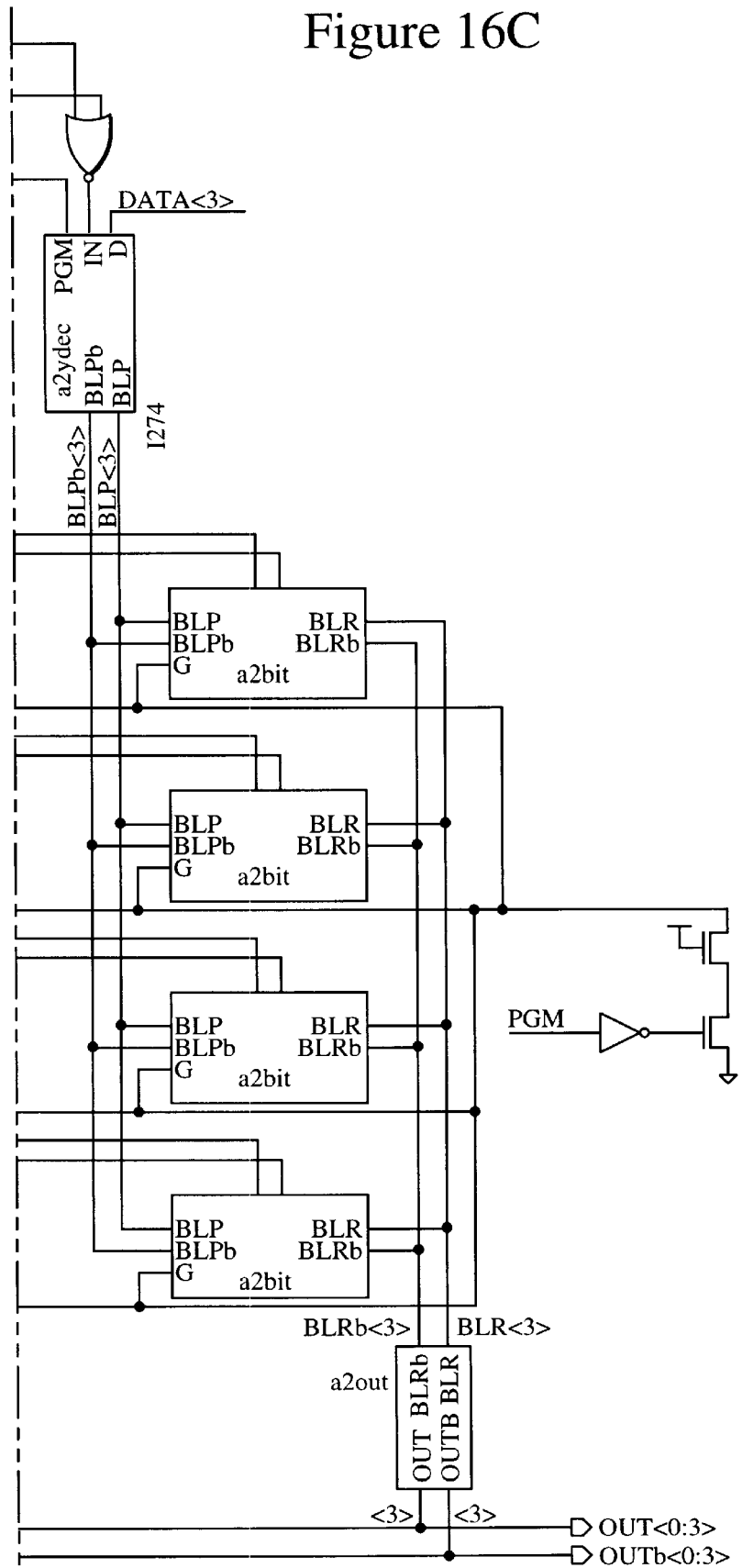
Figure 17:
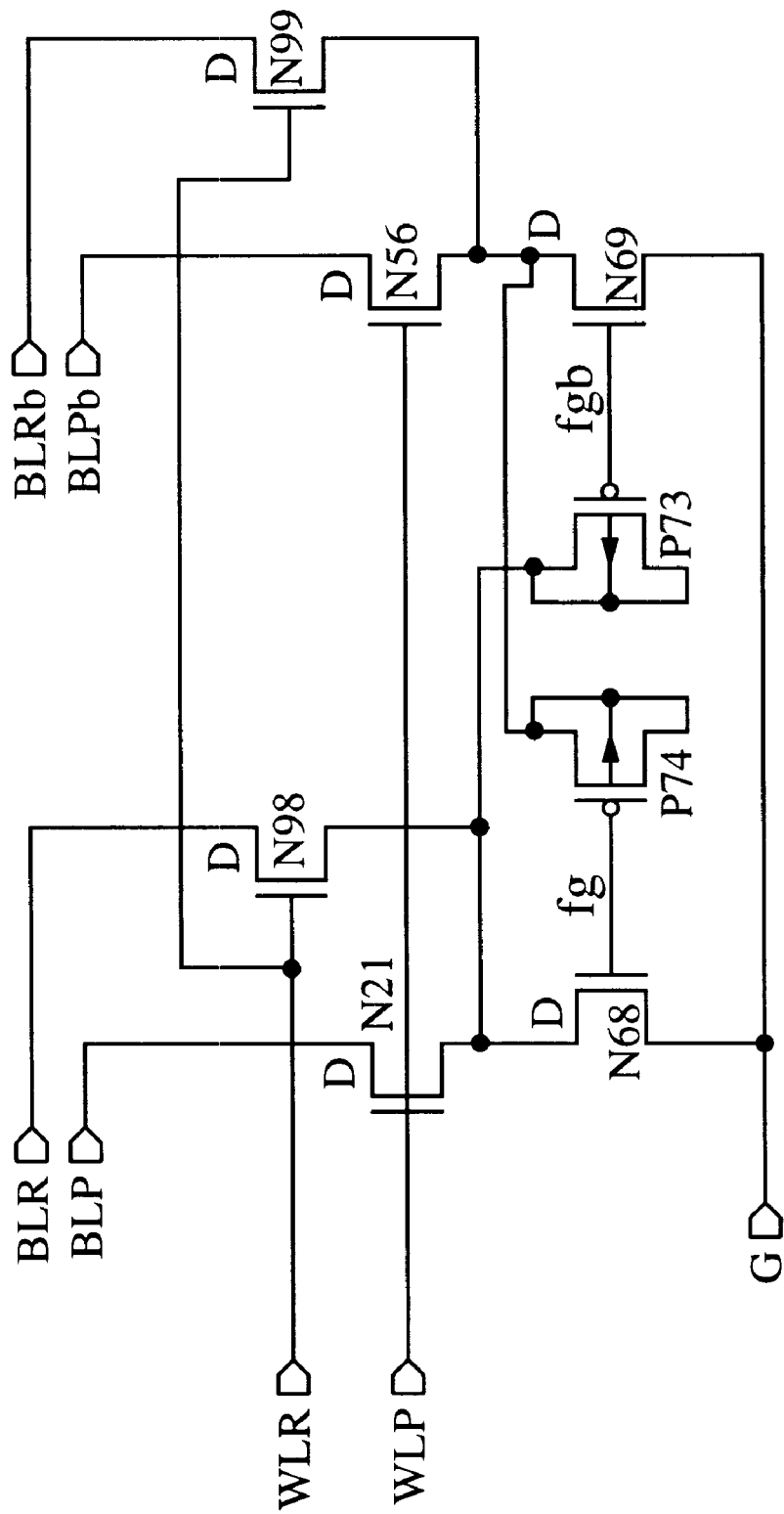
FIG. 17 shows an example of one of the EEPROM cells for the array of FIGS. 16A–C.

Just as the gate oxide breakdown transistors of FIG. 1 can be put in an array (as in FIG. 10), the EEPROM memory cells of FIGS. 4 and 5 can also be put in an array, an example of which is shown in FIG. 16. Again, this is a 4 by 4 array merely for purposes of illustration. In this example, the EEPROM cell of FIG. 5 is the storage element used for purposes of illustration; the EEPROM cell could instead be that of FIG. 4. In FIG. 16, memory cells e2bit are shown for simplicity as blocks. This array of EEPROM cells can be programmed and erased any number of times. An example of an EEPROM cell e2bit is shown in detail in FIG. 17 and includes the above-described combination of transistor N68 and associated capacitor-connected device P74 and, in the second portion of the cell, transistor N69 and associated device P73. Note that these two memory cell portions are connected in a latch configuration together with access transistors N21 and N56. In this configuration, node fg is the gate node of the left hand cell portion and fgb (inversion of fg) is the gate node of the righthand cell portion.

In accordance with one embodiment of the present invention, the read and write paths are separated to eliminate severe breakdown conditions and disturbances. Specifically, access transistors N21 and N56 are used for writing, with their gates each driven by the signal at terminal WLP and their drains driven by respectively the signals provided at terminals BLP and BLPb. Similarly, access transistors N98 and N99 are used for reading with their gates each driven by the signal at terminal WLR and their drains driven respectively by the signals at terminals BLR and BLRb. A write operation includes programming the lefthand portion of the cell and erasing the righthand portion of the cell (or vice versa). If the voltage applied at bit line BLP is equal to 10 volts, the voltage at bit line BLPb is 0 volts, and the voltage applied at word line WLP is 10 volts, the drain terminal of the lefthand portion of the cell (transistor N68) is exposed to a high voltage and its gate node fg to a zero voltage. The drain terminal of the righthand portion of cell (transistor N69) sees 0 volts and its gate node fgb a high voltage. Node fg is discharged, giving the lefthand memory cell portion a low threshold voltage $V_T$ (the erase state) and node fgb of the righthand cell is charged up, putting that cell portion at a high threshold voltage (the programming state). Hence, this is a conventional latch.

Figure 18:
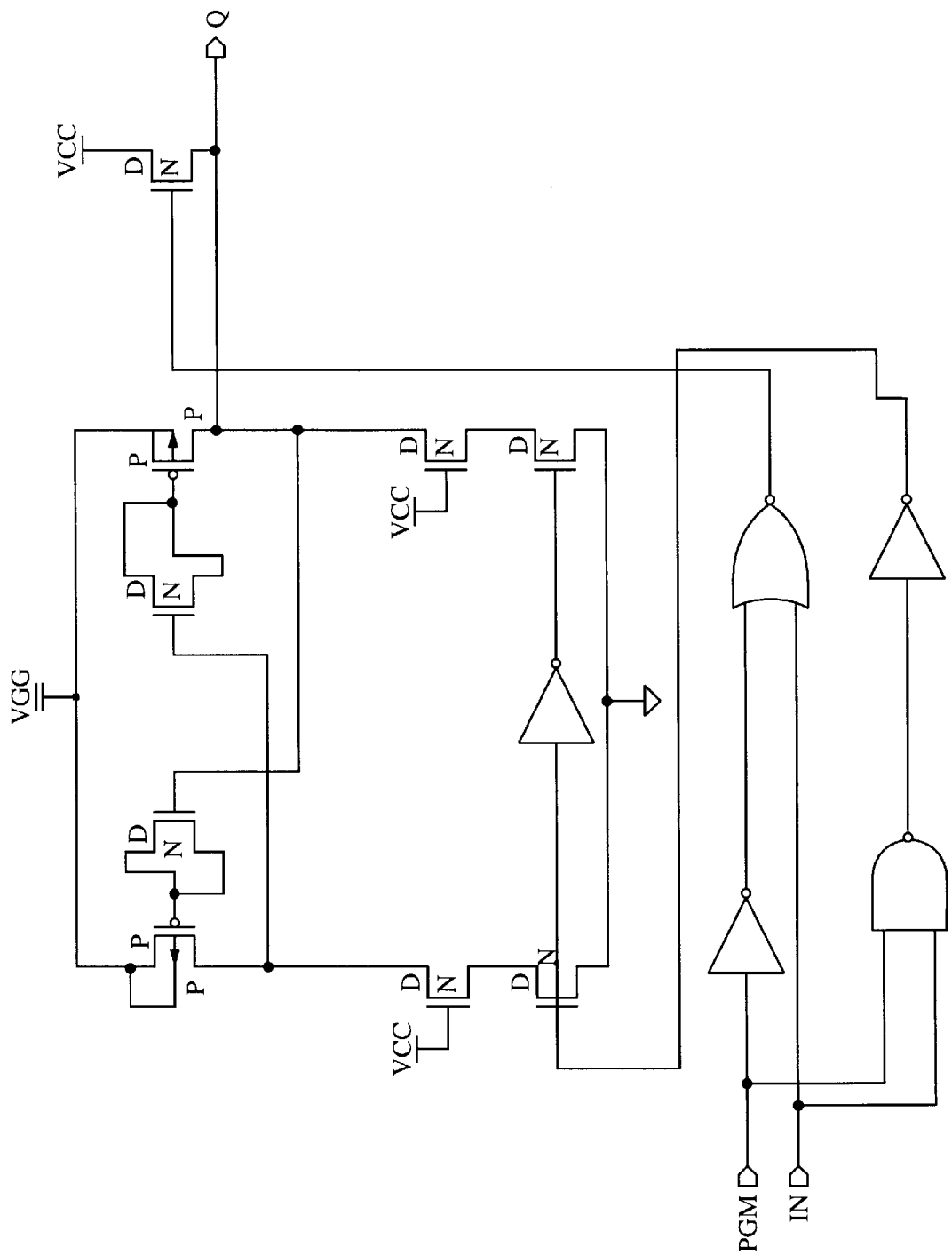
FIG. 18 shows an example of the word line programming circuitry for use with the array of FIG. 16A–C.

Referring back to FIG. 16, a circuit e2xdec drives each of the word lines WL and thus is replicated four times. Detail of one circuit e2xdec is shown in FIG. 18. Note that the NOR gate I263, NOR gate I320 and the inverter I324 together with the first e2xdec circuit I252 form one word line decoding circuit. In the write mode, the selected word line WLP goes to high voltage and the deselected word lines WLP go to voltage $VCC-V_T$. All the read word lines WLR go to voltage VCC. These voltages protect the NMOS devices in the memory array from the high programming voltage and also protect the NMOS devices in the e2out circuits shown in lower portion of FIG. 16 (the read circuits) from breakdown.

Figure 20:
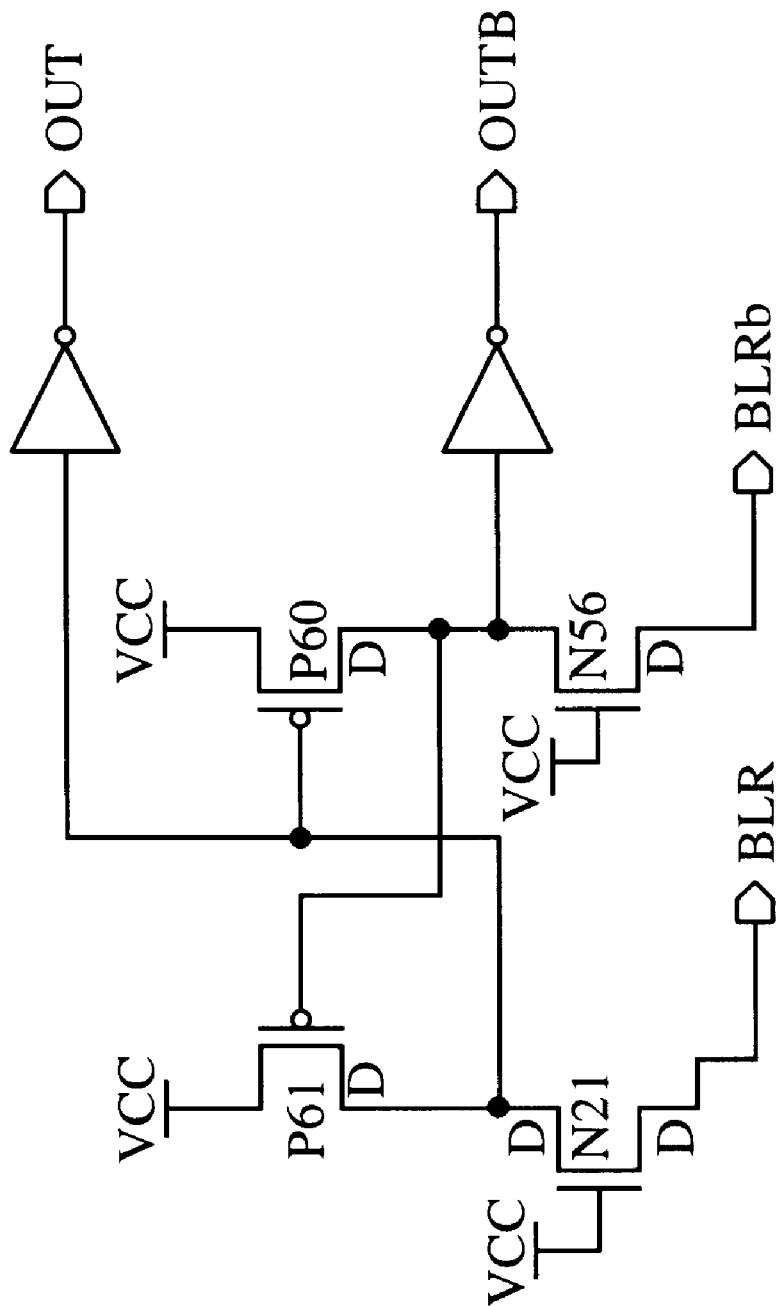
FIG. 20 shows an example of the output circuitry for use with the array of FIG. 16.

A read circuit e2out which is replicated four times, once for each column in the array, and shown in detail in FIG. 20, reads the state of each bit line BLR and BLRb. If bit line BLR is at a high voltage and bit line BLRb is at 0 volts, transistor N56 is on (conductive), thereby transferring a high voltage to line OUTb and to the terminal of device 61. Device P61 then turns on (conductive), and pulls one terminal of transistor N21 to voltage VCC (which turns off transistor P60). The other side of transistor N21 is at high voltage, hence transistor N21 is off. In this manner, there is no current consumption in the e2out circuits.

A way of making sure that the devices do not go into breakdown is to increase the voltage on terminal VCC to 5 volts during a write operation so that the deselected word lines go to 4 volts. (The normal voltage at terminal VCC for 0.35 μm devices is 3.3 volts.) In the read mode, the selected word line WLR goes to voltage VCC and the unselected word lines WLRs go to 0 volts. All the write word lines WLP go to 0 volts. The write bit lines (BLP and BLPb) go to 0 volts. The read bit lines BLR and BLRb read the status of the EEPROM cell. If the lefthand portion of the cell is in the erase state, it pulls down the bit line BLR faster than the righthand portion of the cell pulls down on bit line BLRb. If bit line BLR goes to low voltage, it pulls up bit line BLRb, making the signal at the OUT terminal equal to 1 and the signal at the OUTB terminal to be equal to 0. The entire row of the array can be read using the circuits e2out.

Figure 19:
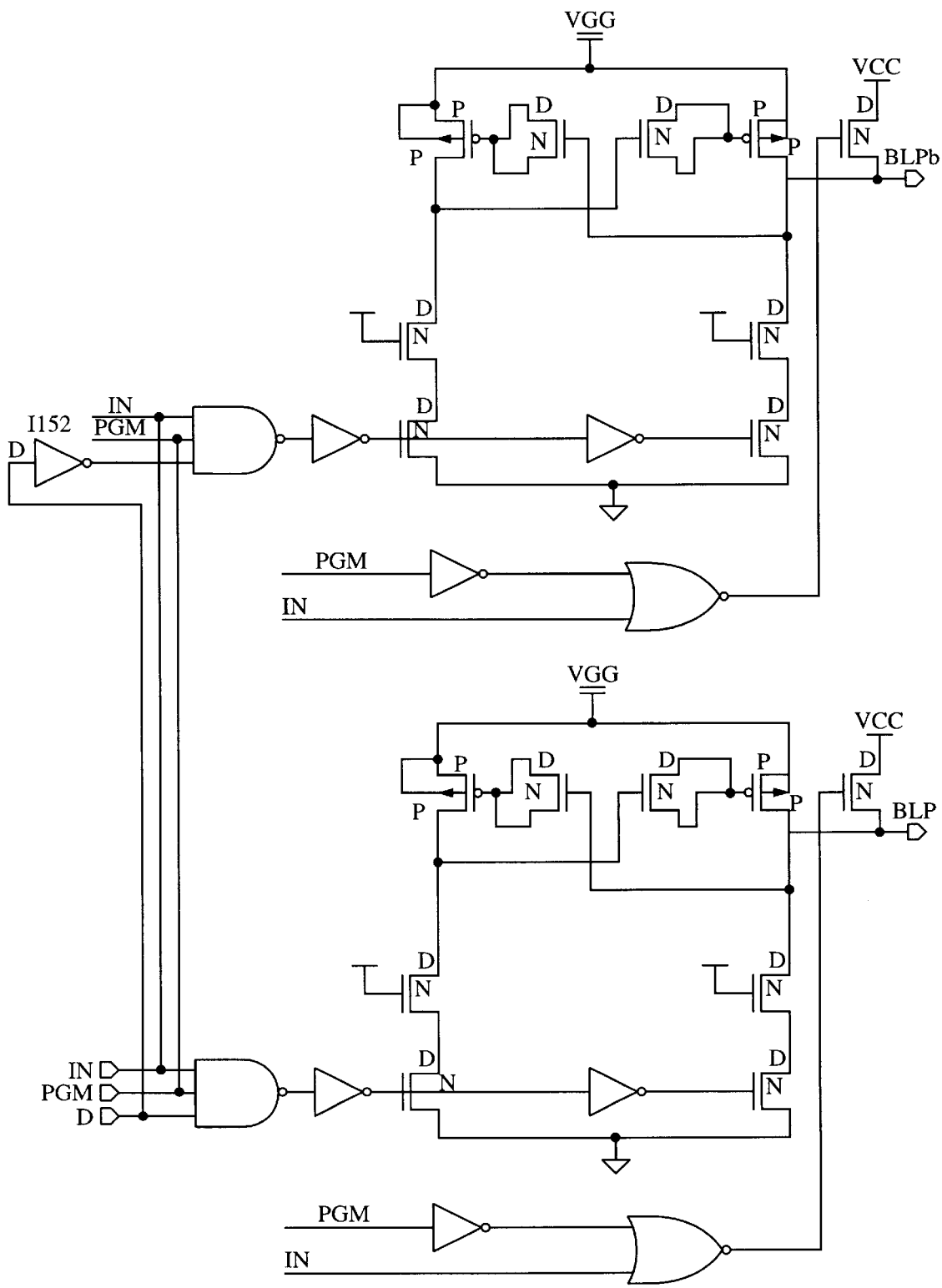
FIG. 19 shows an example of the bit line programming circuitry for use with the array of FIG. 16.

A circuit e2ydec, which is replicated four times as shown in FIG. 16, one for each column in the array, and shown in detail in FIG. 19, generates the bit line signals. In the write mode, depending on the state of the DATA signals, the selected bit line BLP either goes to high voltage or zero, and the inverse bit line BLPb goes to the complementary state. The deselected bit lines are set to voltage $VCC-V_T$. These voltages program one EEPROM device in the cell and erase the other EEPROM device in the cell in the particular location of the memory array, based on F-N tunnelling. Since the F-N tunnelling does not require high current, a row of EEPROM cells in the array can be written simultaneously by latching the data before the write operation.

4. High voltage Charge Pump

In each of the above-described storage circuits, a high programming voltage VGG is required, typically 10 volts. In some embodiments this high voltage is provided from an external source (off-chip). However, in other embodiments it is desirable to generate this high voltage on-chip. While it is well known to use a charge pump to generate a high voltage, typically charge pumps require individual devices capable of operating at high voltage. This is undesirable in accordance with this invention, since it is the intention that all devices of the integrated circuit be conventional low voltage CMOS devices. Therefore, a need arises for a charge pump to generate the high voltage using only conventional low voltage CMOS devices.

Figure 21:
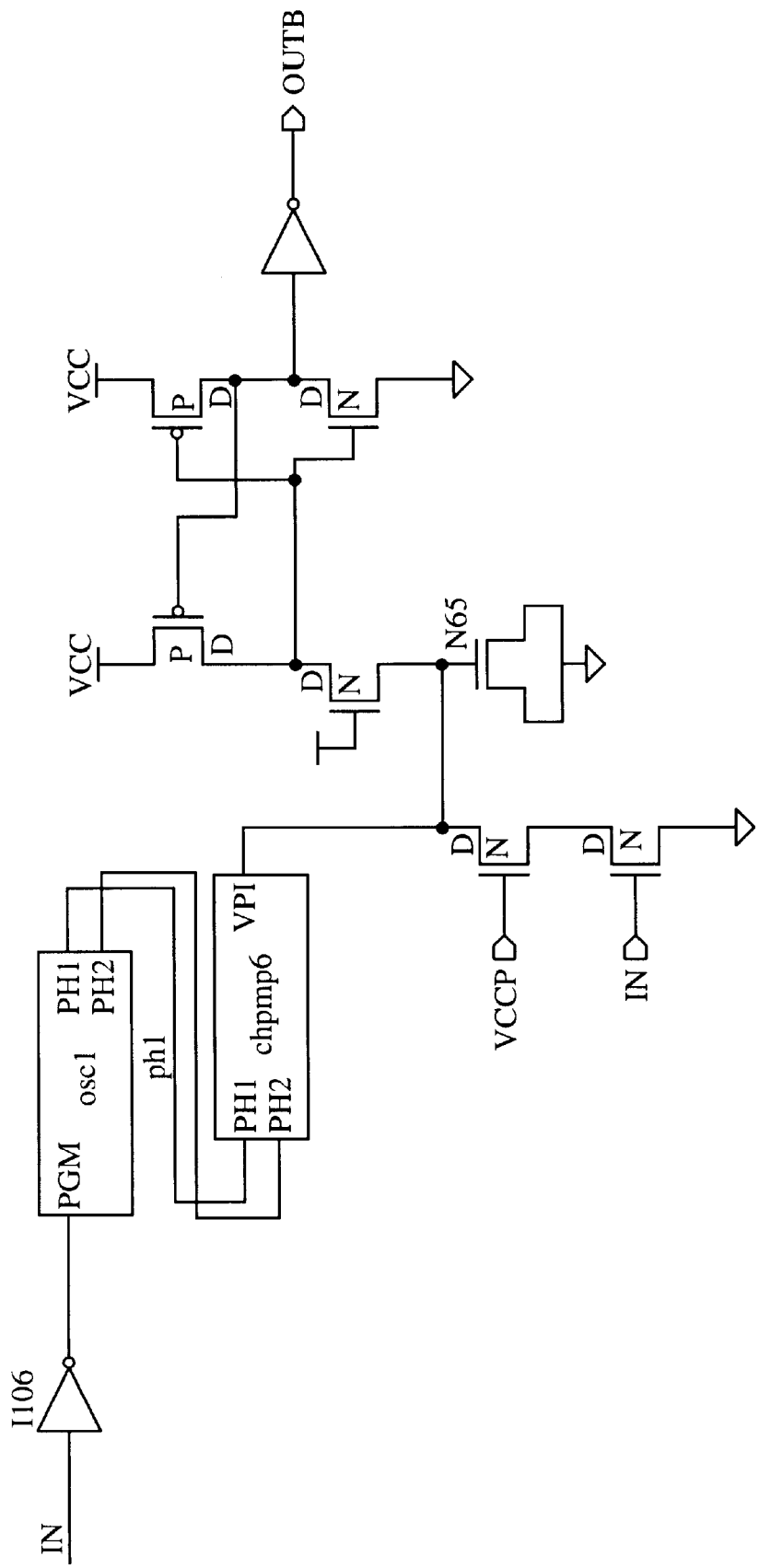
FIG. 21 shows a non-volatile one-time programmable storage element connected to a charge pump providing a programming voltage.

An exemplary use of such a charge pump is shown in FIG. 21 which includes a number of structures similar to those of FIG. 1. Instead of merely providing the high voltage VGG from an external source, high voltage VGG is provided from a charge pump circuit. The charge pump circuit includes an inverter I106, an oscillator osc1, and a charge pump chpmp6 to provide the high voltage VGG at terminal VPI. (The remainder of FIG. 21 is identical to FIG. 1 and is for purposes of illustration.)

Figure 22:
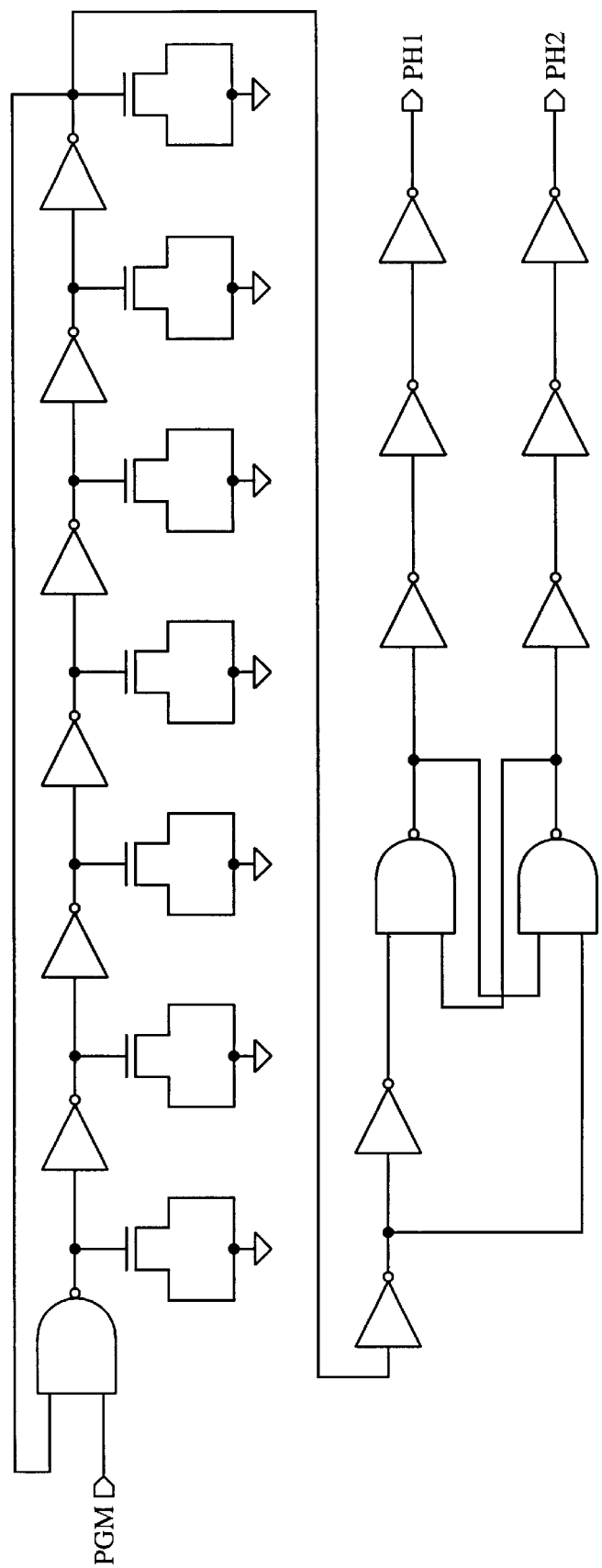
FIG. 22 shows an oscillator circuit for use with the circuit of FIG. 21.

The oscillator circuit osc1, one embodiment shown in detail in FIG. 22, is a conventional 7 stage ring oscillator and generates buffered non-overlapping clock signals PH1 and PH2. These clock signals are provided to charge pump chpnp6 and generate the high voltage at terminal VPI which is connected to the gate of breakdown transistor N65.

Figure 23:
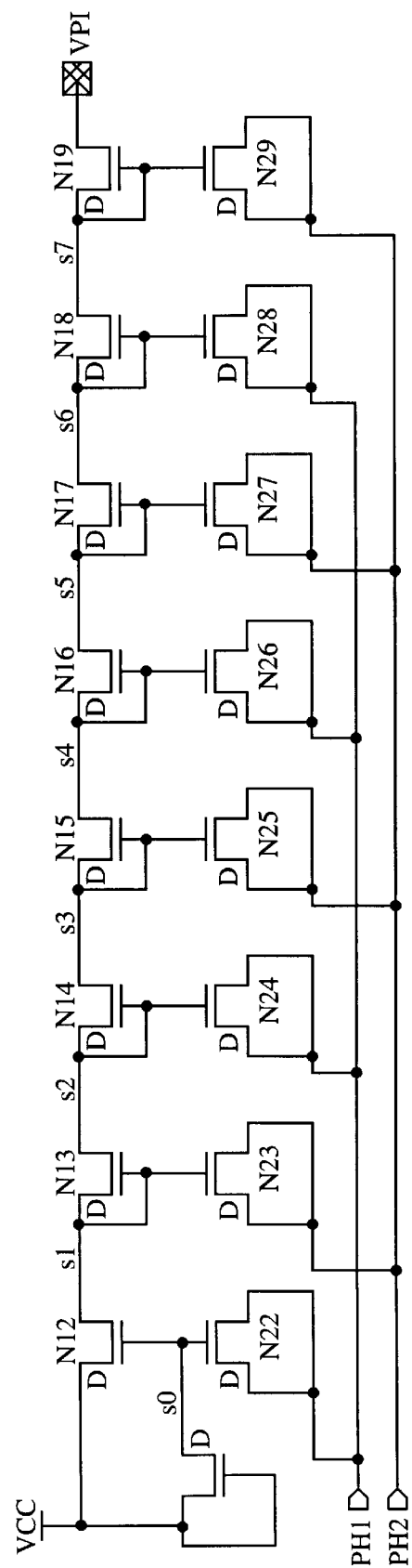
FIG. 23 shows a prior art low voltage charge pump circuit.

For purposes of understanding only, a conventional charge pump is shown in FIG. 23 having eight stages, each stage consisting of, for example, a device N22 connected as a capacitor driving a device N12 connected as a diode.

In this circuit, the devices that are in the path between supply voltage terminal VCC and output terminal VPI (devices N12–N19) are not in the breakdown region since there is less than 3 volts between their gate and drain voltages (although the absolute value of the voltages on them is around 10 volts at VPI). However, undesirably some of the devices that are used to couple the clock signals to the diode devices (devices N22–N29) are in their breakdown regions because their gate voltage exceeds 3 volts when source-drain voltage is at 0 volts. This is particular severe for the devices in the stages near the end of the chain, i.e. devices N28 and N29. Device N29 is exposed to about 10 volts at its gate which undesirably would destroy it.

Figure 24:
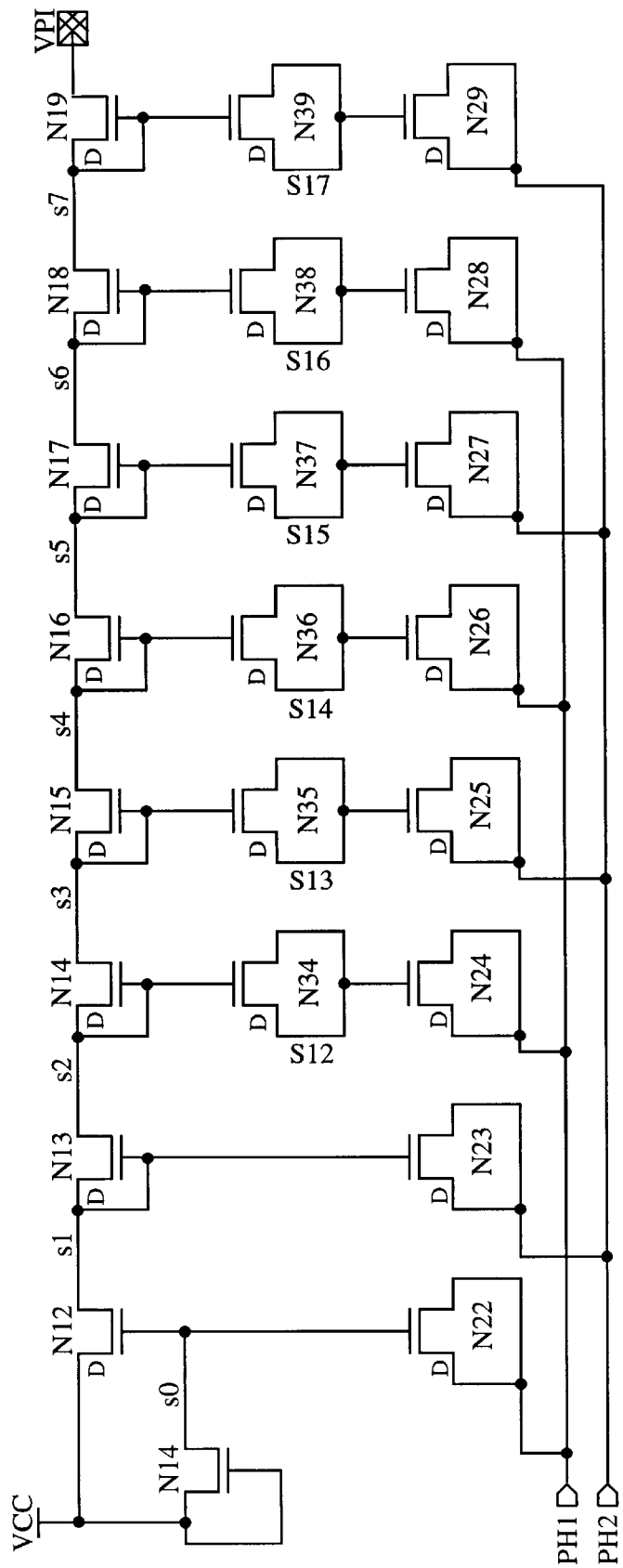
FIG. 24 shows a high voltage charge pump circuit in accordance with this invention.

Therefore, to avoid this problem, the high voltage charge pump of FIG. 24 avoids breaking down the capacitor coupled devices and is suitable for change pump chpmp6 of FIG. 21.

The high voltage charge pump of FIG. 24 is identical to that of FIG. 23 except that an additional capacitor-connected device is provided in each of the upper charge pump stages. These additional devices N34–N39 are respectively connected in series with the capacitor-connected devices N24–N29. No such devices are added to the first two stages since in these stages there is no exposure to high voltage, i.e. at devices N22 and N23. With the charge pump of FIG. 24, the gate of each capacitor-connected device, even at the last stage, is exposed only to a maximum voltage of about 5 volts and hence will not break down. Hence, a charge pump as in FIG. 24 is advantageously fabricated using all low voltage CMOS devices, yet providing a high output voltage as needed for programming.

It is to be understood however that the charge pump shown in FIG. 24 is not required for certain embodiments of this invention and that the needed high voltage may be otherwise provided.

In general, the present invention is not limited to the above-disclosed 0.35 μm minimum feature size but is applicable to other transistor sizes less than 0.35 μm minimum feature size. The technologies having 0.35 μor lower minimum feature size have gate oxides of 70 Å or less. This gate oxide is used both for gate breakdown structure and Fowler-Nordheim tunneling in EEPROM circuits for non-volatile storage. Hence, an extension of the standard CMOS process is not needed. In general, the size of the particular devices in accordance with this invention are not critical except that certain of the devices should be larger, i.e. more powerful, than the minimum feature size (transistors in the high voltage paths should have, for example, a 0.8 μm channel length). These would be e.g. for FIG. 1, all the devices in programming circuit 14, thereby avoiding punchthrough of those devices.

This disclosure is illustrative and not limiting; further modifications will be apparent to one of ordinary skill in the art in light of this disclosure and are intended to fall within the scope of the appended claims.

We claim:

1. A non-volatile storage array for use in an integrated circuit comprising:

an N×M array of one-time programmable storage elements, each element storing at least one bit of information, where N and M are each at least one, each storage element having a control terminal and an output terminal;

a programming circuit coupled to the control terminal of each storage element; and an output circuit coupled to the output terminal of each storage element;

wherein the storage elements, the programming circuit, and the output circuit are each comprised of low voltage CMOS devices, wherein the low voltage CMOS devices have a standard operating voltage of less than 4 Volts.

2. The non-volatile storage array of claim 1, wherein each low voltage CMOS device, including each storage element, has a gate dielectric thickness of less than 100 Å.

3. The non-volatile storage array of claim 1, wherein each storage element includes a device having a gate terminal coupled to the control terminal, a source terminal coupled to a reference voltage and a drain terminal coupled to the reference voltage.

4. The non-volatile storage array of claim 3, wherein each storage element further includes an access transistor coupled between the gate terminal of the device and the control terminal of the storage element.

5. The non-volatile storage array of claim 2, wherein each storage element in its unprogrammed state is a capacitor and in its programmed state has its gate dielectric broken down.

6. The non-volatile storage array of claim 3, wherein the output circuit is coupled to the gate terminal of the device.

7. The non-volatile storage array of claim 1, wherein the programming circuit has three input terminals for respectively receiving a programming high voltage, an operating voltage lower than the programming high voltage, and an input signal.

8. The non-volatile storage array of claim 7, further comprising a charge pump coupled to the programming high voltage terminal of the programming circuit.

9. The non-volatile storage array of claim 8, the charge pump including a plurality of stages, each stage including:

a first capacitor device;

a second capacitor device series-connected to the first capacitor device; and a diode device series-connected to the second capacitor device, an output voltage from the stage being provided at the diode device.

10. The non-volatile storage array of claim 1, wherein the storage elements are comprised of all low voltage CMOS devices.

* * * * *